(12) United States Patent
Chandolu et al.

(10) Patent No.: US 11,800,711 B2
(45) Date of Patent: Oct. 24, 2023

(54) INTEGRATED ASSEMBLIES, AND METHODS OF FORMING INTEGRATED ASSEMBLIES

(71) Applicant: Micron Technology, Inc., Boise, ID (US)

(72) Inventors: Anilkumar Chandolu, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 17/322,246

(22) Filed: May 17, 2021

(65) Prior Publication Data

US 2022/0068965 A1 Mar. 3, 2022

Related U.S. Application Data

(60) Provisional application No. 63/072,061, filed on Aug. 28, 2020.

(51) Int. Cl.
| | |
|---|---|
| H01L 27/11582 | (2017.01) |
| H10B 43/27 | (2023.01) |
| H10B 41/10 | (2023.01) |
| H10B 41/27 | (2023.01) |
| H10B 43/10 | (2023.01) |

(52) U.S. Cl.
CPC .............. *H10B 43/27* (2023.02); *H10B 41/10* (2023.02); *H10B 41/27* (2023.02); *H10B 43/10* (2023.02)

(58) Field of Classification Search
CPC ................................ H10B 43/27; H10B 43/20
See application file for complete search history.

(56) References Cited

U.S. PATENT DOCUMENTS 9,524,979 B2 * 12/2016 Arai ................. H10B 43/20
2020/0266206 A1 * 8/2020 Fukuo ............... H10B 41/27

* cited by examiner

*Primary Examiner* — Christopher A Johnson
(74) *Attorney, Agent, or Firm* — Wells St. John P.S.

(57) ABSTRACT

Some embodiments include a method of forming an integrated assembly. Laterally alternating first and second sacrificial materials are formed over a conductive structure, and then a stack of vertically alternating first and second levels is formed over the sacrificial materials. The first levels include first material and the second levels include insulative second material. Channel-material-openings are formed to extend through the stack and through at least some of the strips. Channel-material-pillars are formed within the channel-material-openings. Slits are formed to extend through the stack and through the sacrificial materials. The first sacrificial material is replaced with first conductive material and then the second sacrificial material is replaced with second conductive material. At least some of the first material of the stack is replaced with third conductive material. Some embodiments include integrated assemblies.

16 Claims, 45 Drawing Sheets

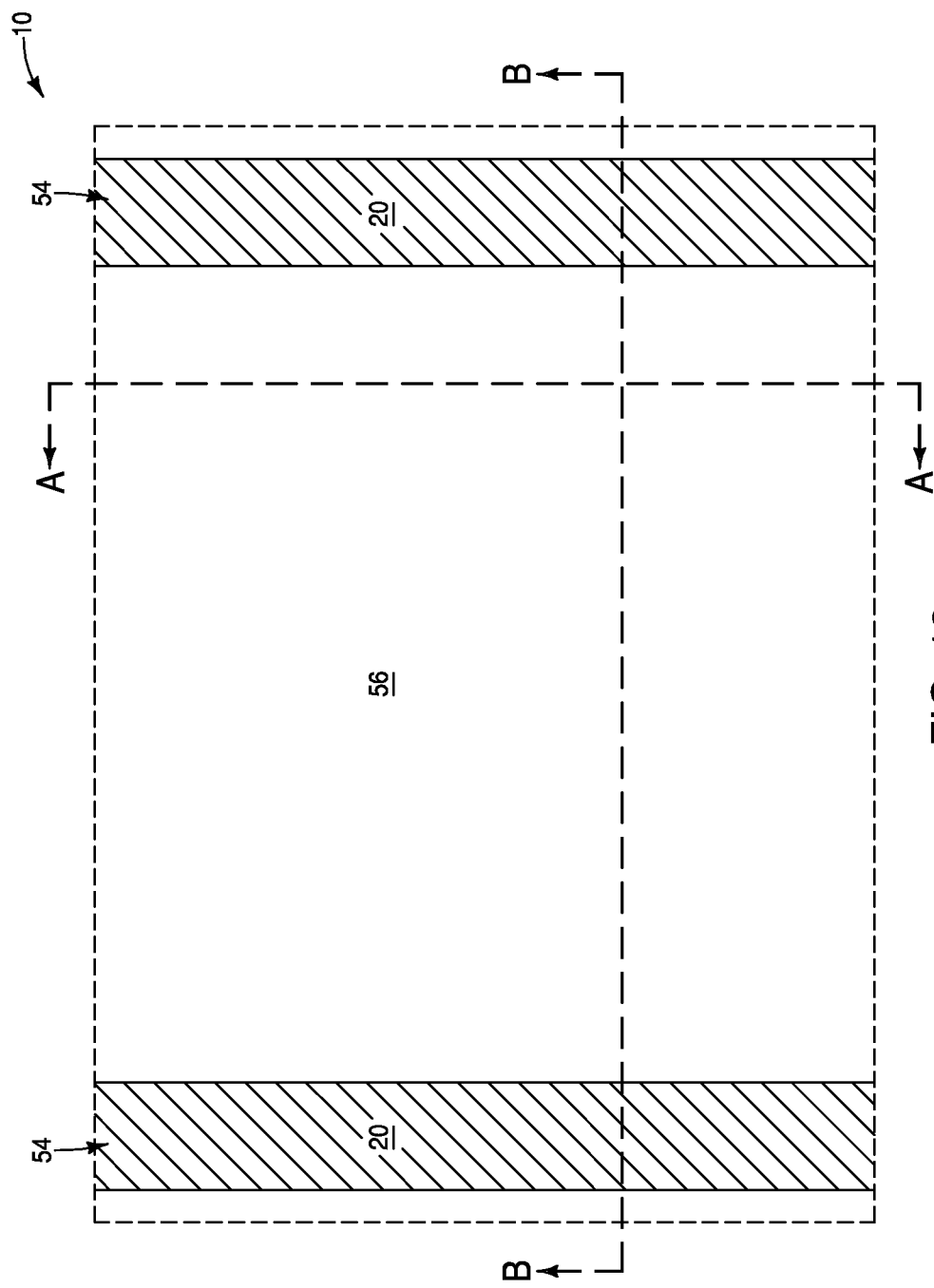
FIG. 13
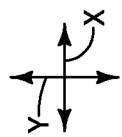

INTEGRATED ASSEMBLIES, AND METHODS OF FORMING INTEGRATED ASSEMBLIES

RELATED PATENT DATA

This application claims priority to and the benefit of U.S. Provisional Patent Application Ser. No. 63/072,061, filed Aug. 28, 2020, the disclosure of which is incorporated herein by reference.

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel-material-pillar, and a region of such pillar may be gatedly coupled with an SGS device. The gatedly-coupled portion of the channel-material-pillar is a portion that overlaps a gate of the SGS device.

It can be desired that at least some of the gatedly-coupled portion of the channel-material-pillar be heavily doped. In some applications it can be desired that the gatedly-coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an adjacent doped semiconductor material.

It is desired to develop new methods of forming memory devices, and to develop new memory devices.

BRIEF DESCRIPTION OF THE DRAWINGS

FIGS. 5A-16A are diagrammatic cross-sectional side views along the lines A-A of FIGS. 5-16, respectively.

FIGS. 5A-1 and 16A-1 are diagrammatic cross-sectional side views of example embodiments alternative to those of FIGS. 5A and 16A, respectively.

FIGS. 5B-16B are diagrammatic cross-sectional side views along the lines B-B of FIGS. 5-16, respectively.

FIGS. 11C-14C are diagrammatic cross-sectional top-down views along the lines C-C of FIGS. 11A-14A, respectively; and along the lines C-C of FIGS. 11B-14B, respectively.

DETAILED DESCRIPTION OF THE ILLUSTRATED EMBODIMENTS

Some embodiments include methods of using two different sacrificial materials to support a stack of alternating first and second levels. Channel-material-pillars are formed to extend through the stack and through the sacrificial materials. Subsequently, the first and second sacrificial materials are sequentially replaced with first and second conductive materials, respectively. The first and second conductive materials may or may not be compositionally the same as one another. The first and second conductive materials are incorporated into a source structure.

Example embodiments are described with reference to FIGS. 5-16. FIGS. 5-16 describe example sequential steps of an example method, with FIG. 16 showing an example structure which may be formed by the example method.

Figure 5:
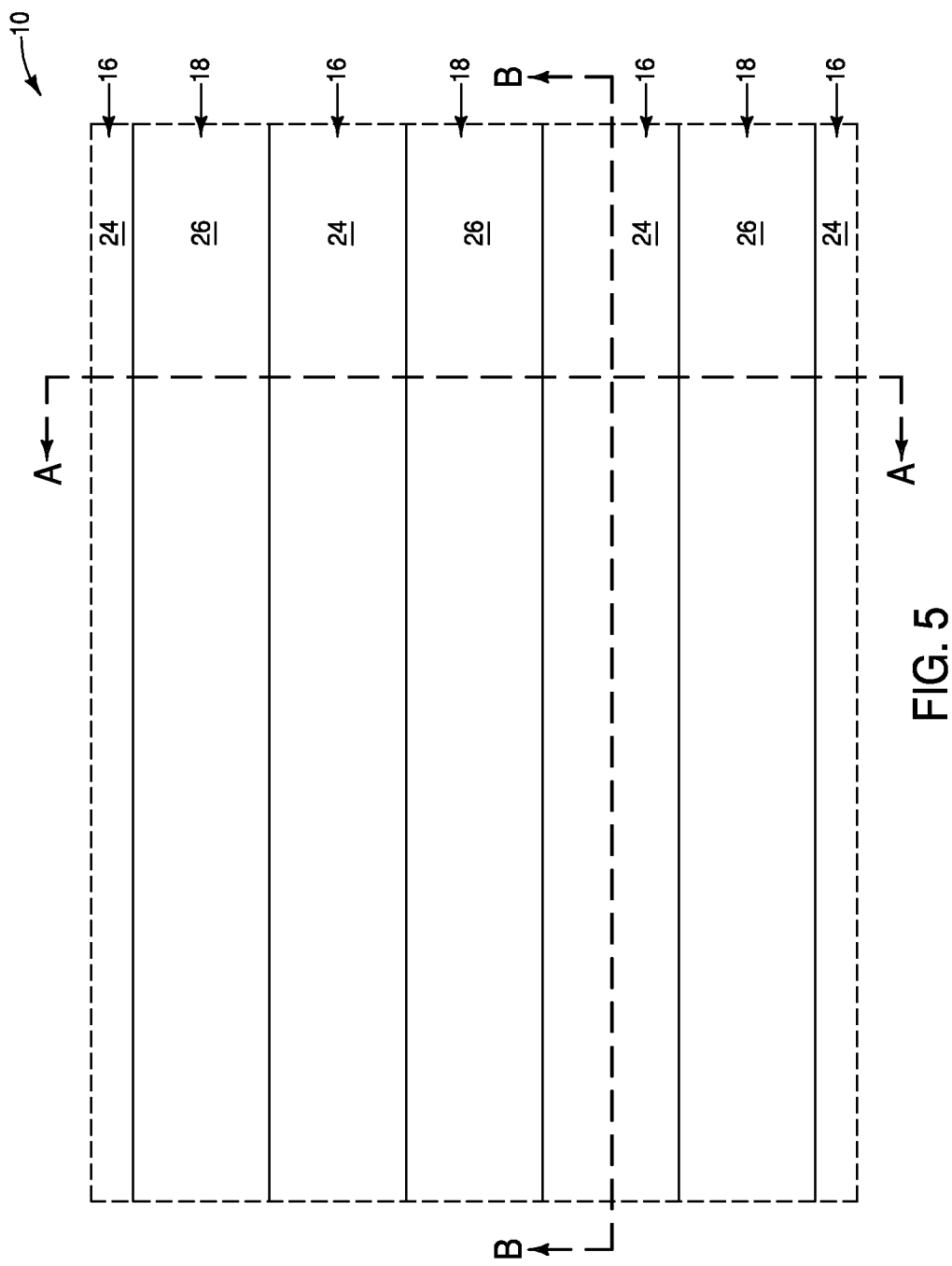
FIGS. 5-16 are diagrammatic top-down views of an example integrated assembly at example sequential process stages of an example embodiment method for forming an example memory device.
Figure 5:
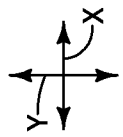
Figure 5A:
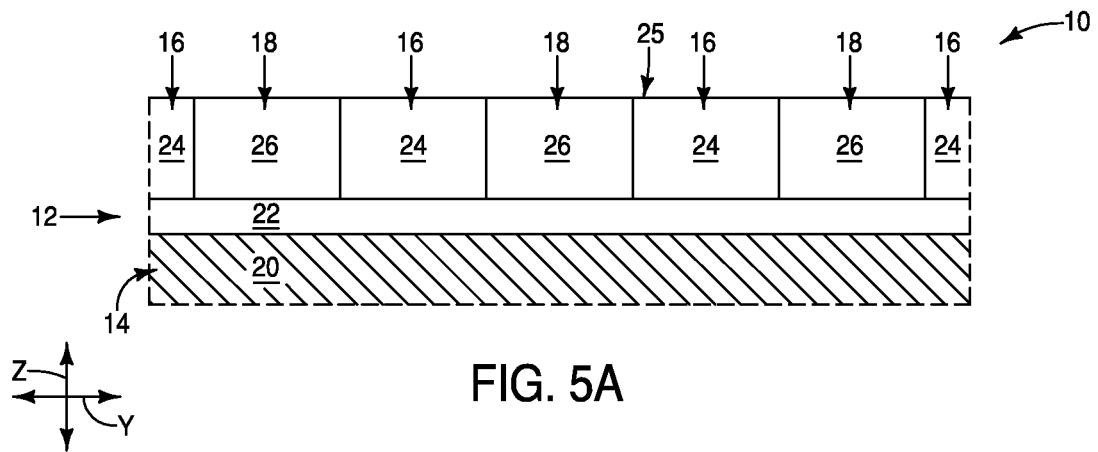
Figures 1, 5A:
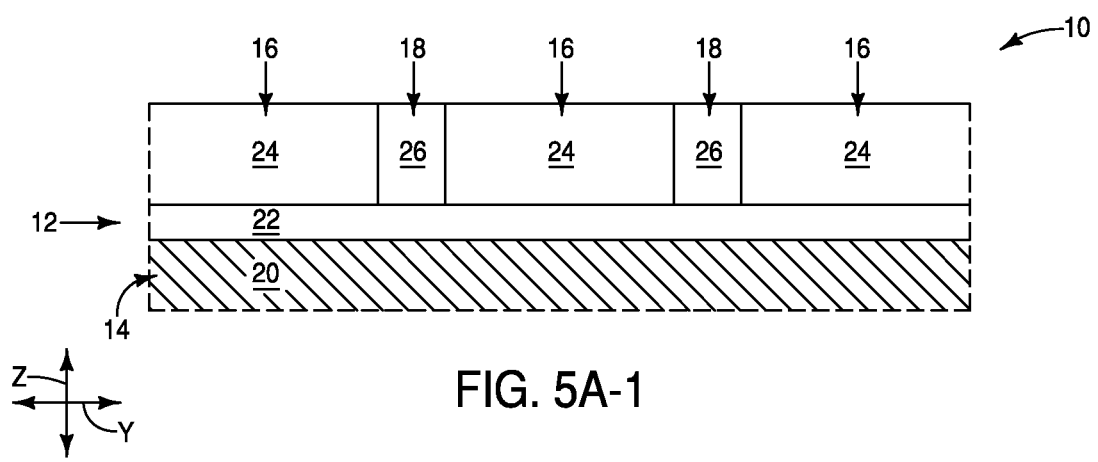
Figure 5B:
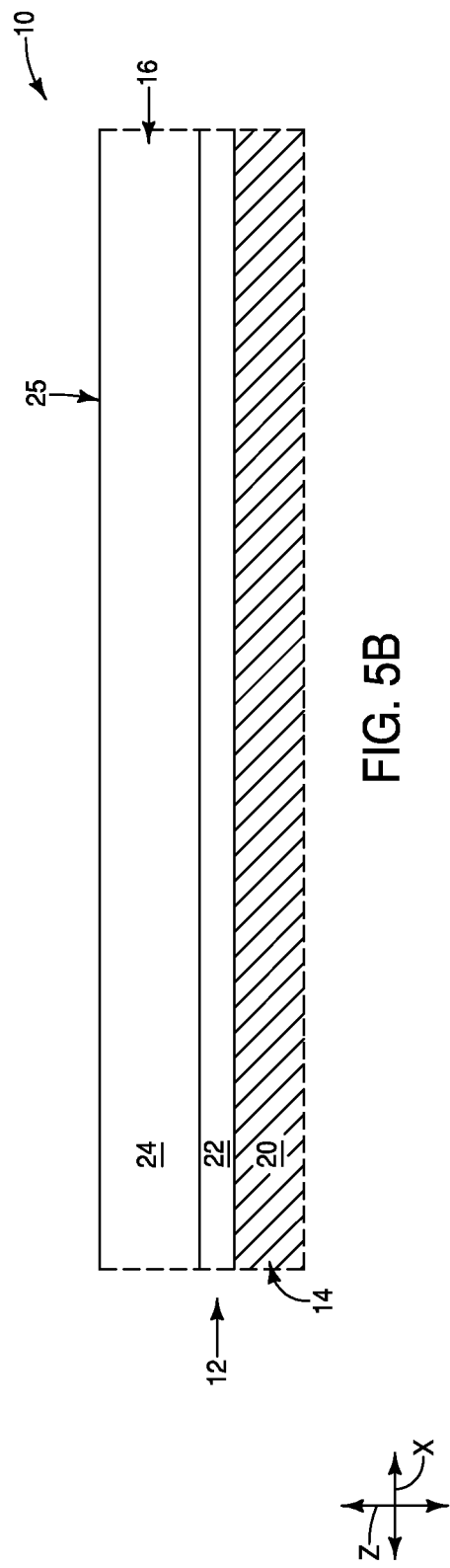

Referring to FIGS. 5-5B, an example integrated assembly 10 includes a layer 12 over a conductive expanse 14, and includes alternating strips 16 and 18 over the layer 12.

The conductive expanse 14 may be supported by an underlying semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The conductive expanse 14 comprises conductive material 20. The conductive material 20 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 20 may comprise metal-containing material, such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the conductive material 20 may comprise, consist essentially of, or consist of WSi, where the chemical formula indicates primary constituents rather than a specific stoichiometry. The WSi may be alternatively referred to as WSix, where x is a number greater than zero.

The layer 12 comprises a material 22. In some embodiments, the material 22 may comprise conductively-doped (e.g., heavily-doped) semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the material 22 may comprise doped silicon.

The layer 12 may be formed to any suitable vertical thickness. For instance, in some embodiments the layer 12 may be formed to a thickness within a range of from about 10 nanometers (nm) to about 20 nm, within a range of from about 10 nm to about 50 nm, etc. The layer 12 may be omitted in some embodiments.

The strips 16 and 18 comprise materials 24 and 26, respectively. In some embodiments, the strips 16 and 18 may be referred to as first and second strips, respectively, and the materials 24 and 26 may be referred to as first and second materials, respectively. The materials 24 and 26 are eventually removed and replaced with other materials, and accordingly may be referred to as sacrificial materials. In some embodiments, the materials 24 and 26 may be referred to as a first sacrificial material and a second sacrificial material, respectively.

The materials 24 and 26 may comprise any suitable compositions, and are selectively removable relative to one another, and relative to the materials of the layer 12 and the expanse 14. In some embodiments, the material 24 may comprise, consist essentially of, or consist of silicon dioxide; and the material 26 may comprise, consist essentially of, or consist of silicon nitride.

The strips 16 and 18 extend along a first horizontal direction (an illustrated x-axis direction), and alternate with one another along a second horizontal direction (an illustrated y-axis direction). In some embodiments, the strips 16 and 18 may be considered to laterally alternate with one another. Although the strips 16 and 18 are shown to be straight along the x-axis direction, in other embodiments the strips may be curved, wavy, etc.

Figure 1:
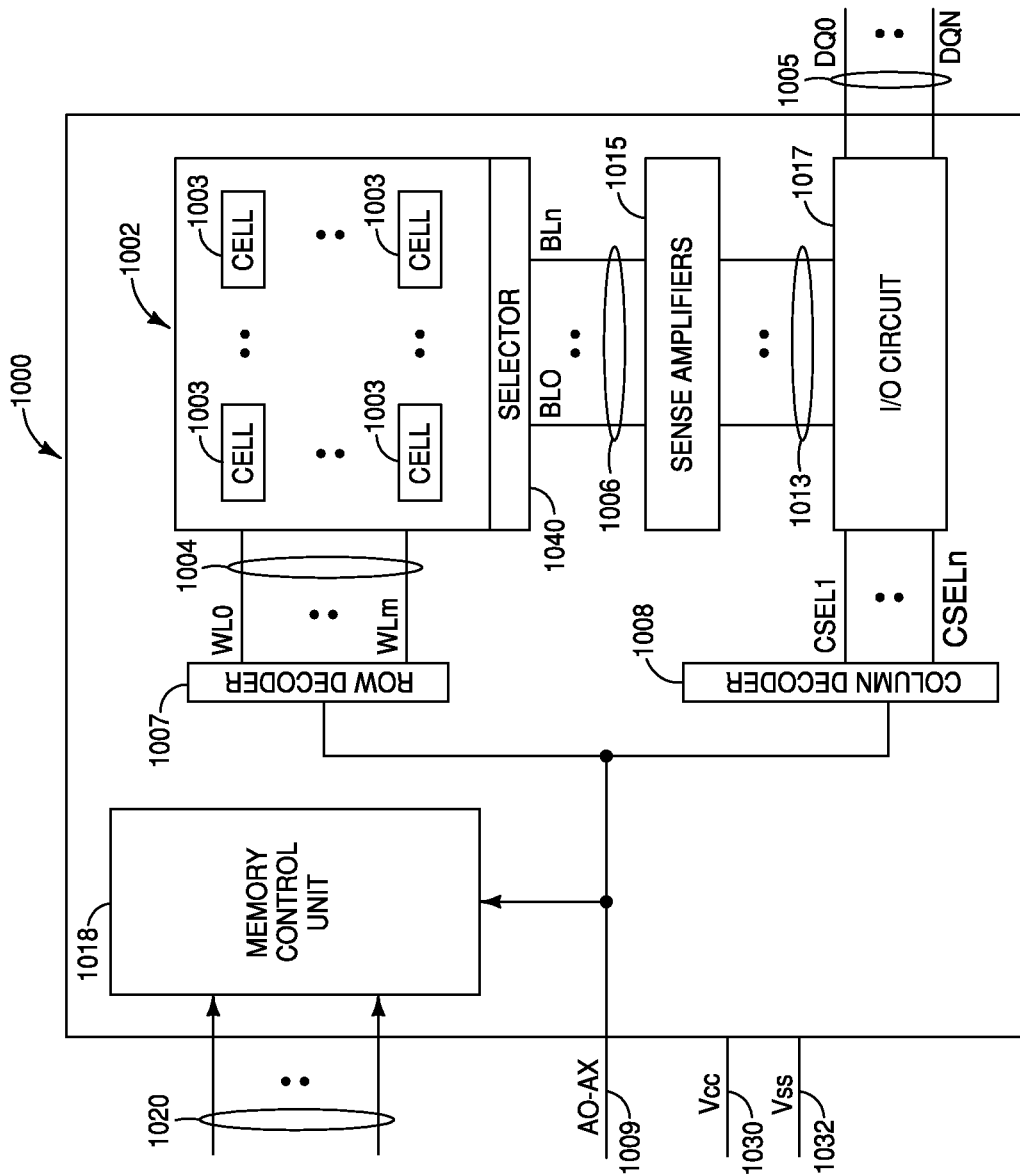
FIG. 1 shows a block diagram of a prior art memory device having a memory array with memory cells.
Figure 2:
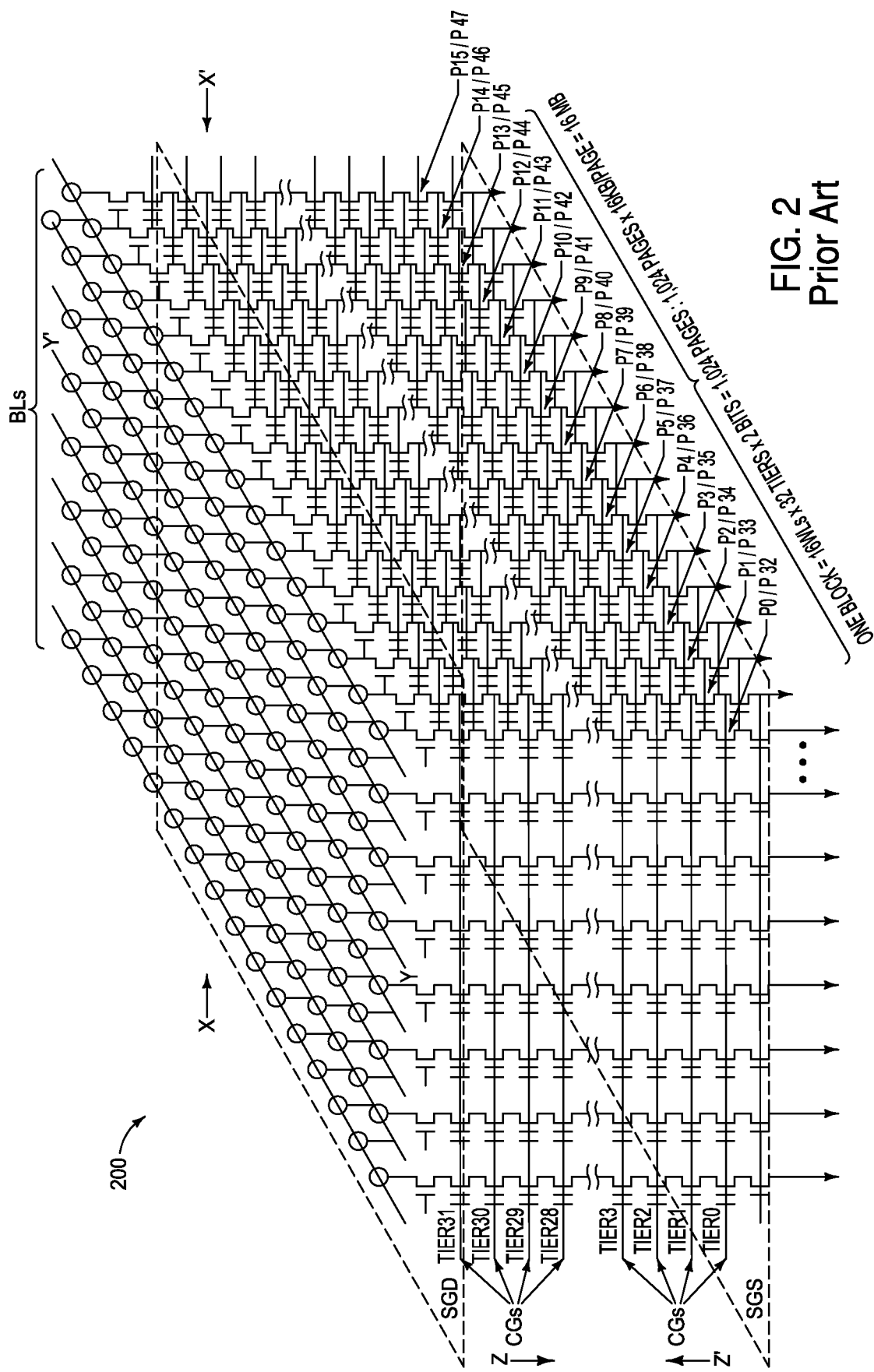
FIG. 2 shows a schematic diagram of the prior art memory device of FIG. 1 in the form of a 3D NAND memory device.
Figure 3:
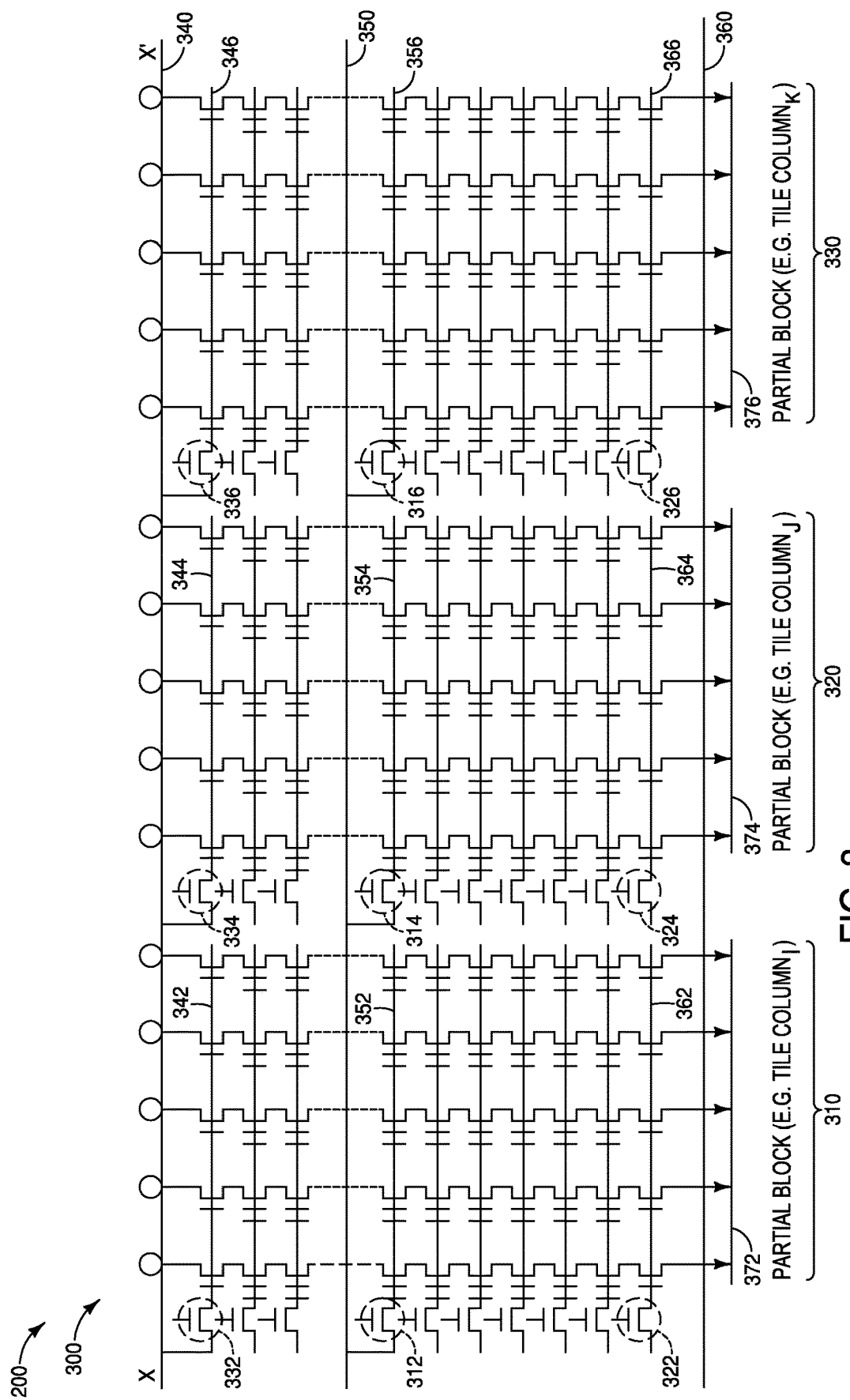
FIG. 3 shows a cross-sectional view of the prior art 3D NAND memory device of FIG. 2 in an X-X' direction.
Figure 4:
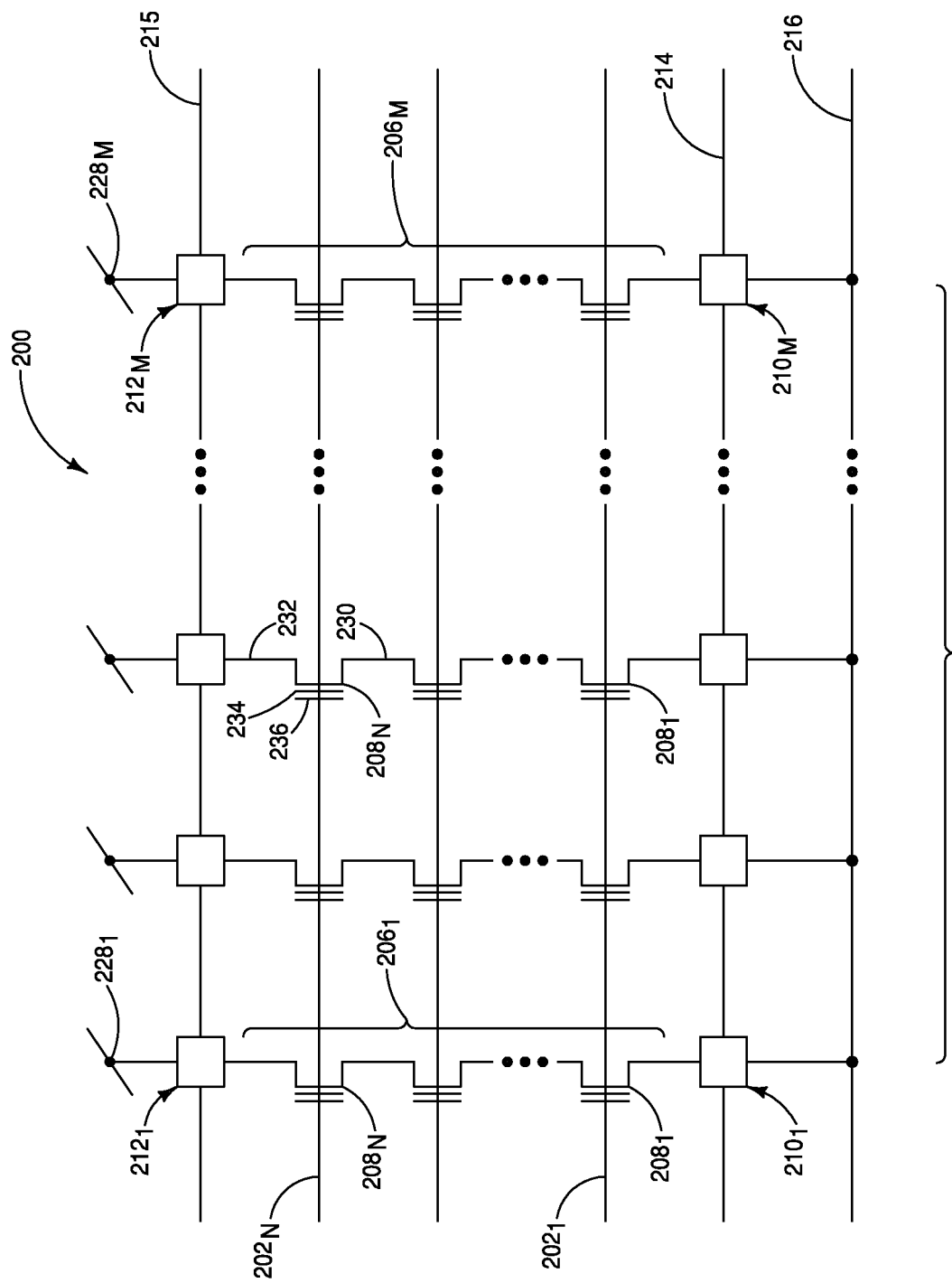
FIG. 4 is a schematic diagram of a prior art NAND memory array.

The embodiment of FIG. 5A shows the strips 16 and 18 to be about the same lateral thickness as one another. In other embodiments, the strips 16 and 18 may be different lateral thicknesses relative to one another. For instance, FIG. 5A-1 shows an example embodiment analogous to that of FIG. 5A, but in which the strips 16 and 18 have different lateral thicknesses relative to one another.

The alternating strips 16 and 18 may be formed with any suitable methodology. For instance, in some embodiments one of the materials 24 and 26 may be formed and patterned into strips which are spaced from one another by gaps (trenches), and then the other of the materials 24 and 26 may be formed within the trenches.

A planarized surface 25 is formed to extend across the materials 24 and 26. The planarized surface may be formed with any suitable processing, including, for example, chemical-mechanical polishing (CMP).

The materials 24 and 26 may have any suitable vertical thickness. In some embodiments, such vertical thickness may be within a range of from about 10 nm to about 50 nm, within a range of from about 10 nm to about 100 nm, etc.

Figure 6:
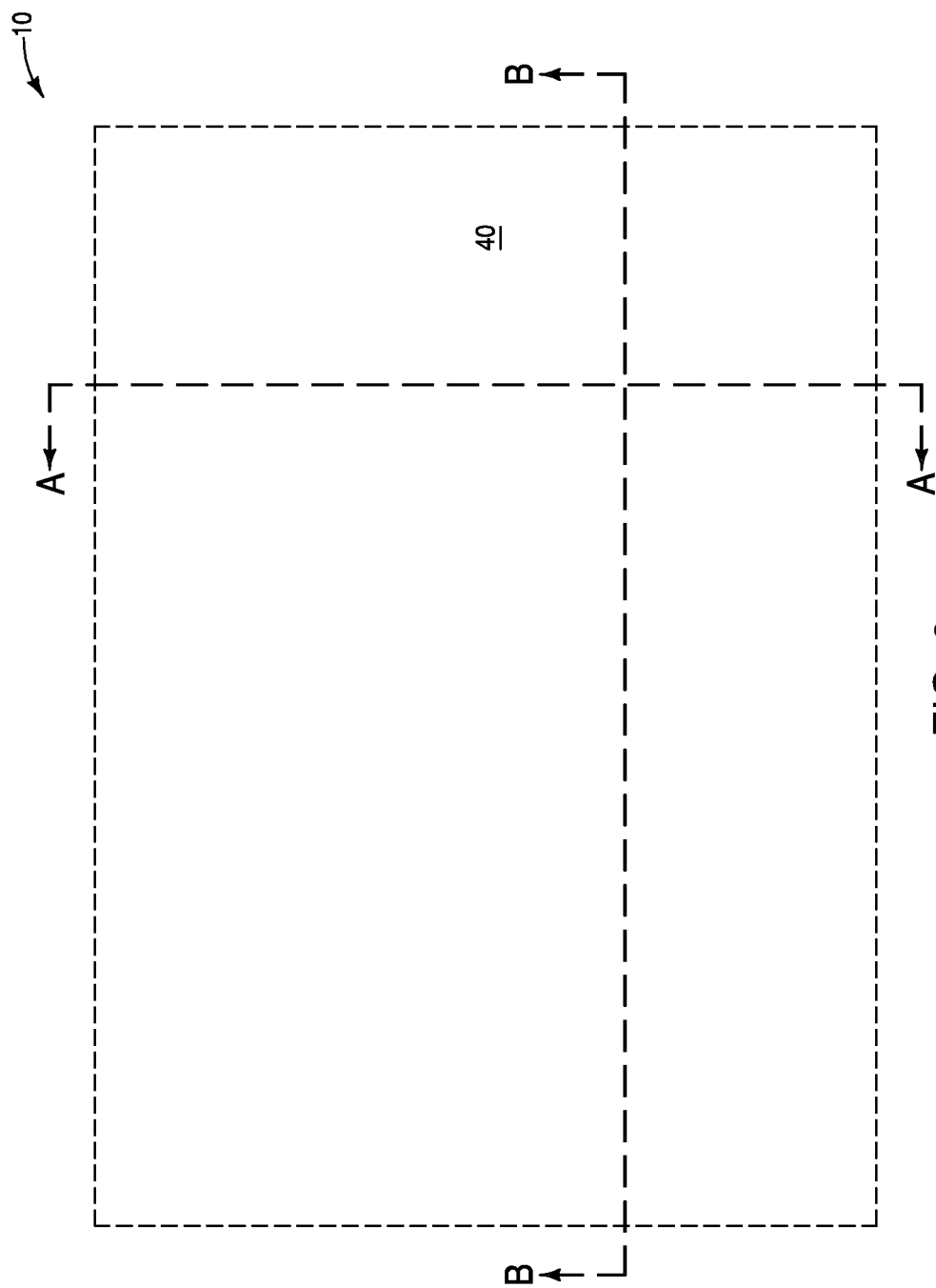
Figure 6A:
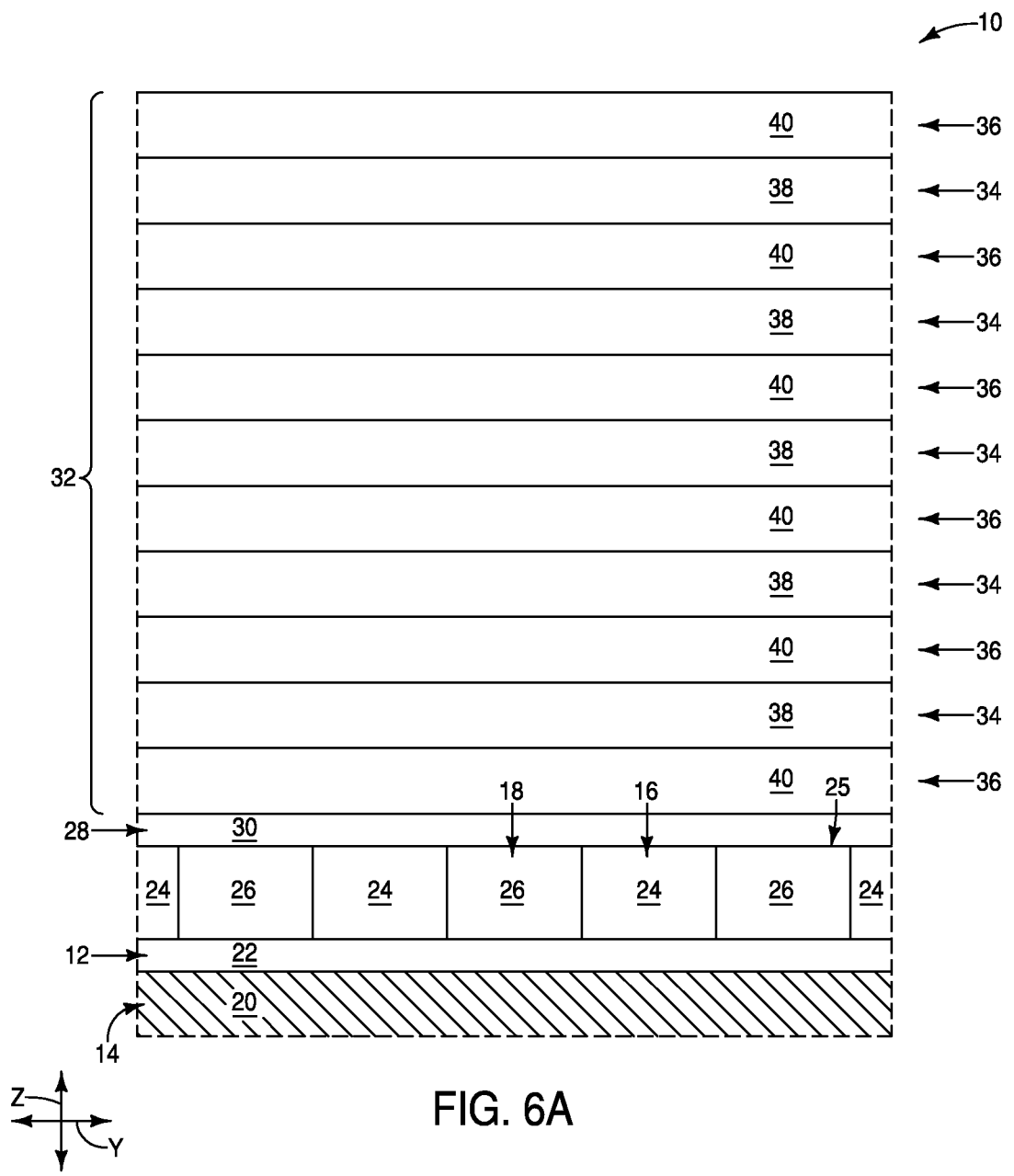
Figure 6B:
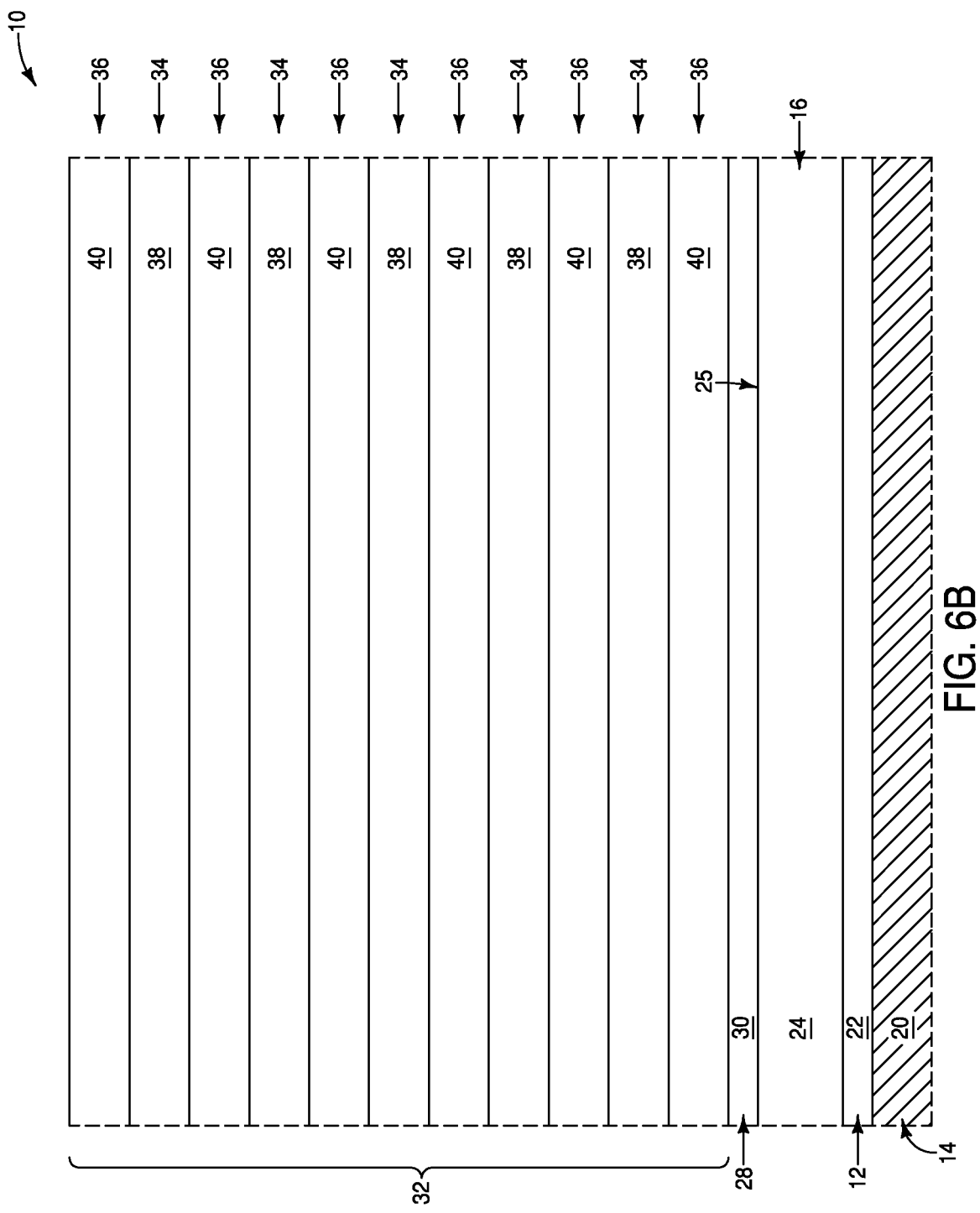

Referring to FIGS. 6-6B, a layer 28 is formed over the alternating strips 16 and 18, and specifically is formed on the planarized surface 25. The layer 28 comprises a material 30. The material 30 may be conductive, and may, for example, comprise conductively-doped semiconductor material. In some embodiments, the material 30 of the layer 28 may be identical to the material 22 of the layer 12. In other embodiments, the material 30 of the layer 28 may be compositionally different relative to material 22 of the layer 12. In some embodiments, the layer 28 may be insulative (e.g., the material 30 may comprise aluminum oxide, hafnium oxide, etc.).

The layer 28 may be referred to as a second layer to distinguish it from the first layer 12. The layer 28 may be formed to a same vertical thickness as a layer 12, or may be formed to a different vertical thickness than the layer 12. In some embodiments, the layer 28 may be formed to a thickness within a range of from about 10 nm to about 20 nm, within a range of from about 10 nm to about 50 nm, etc. The layer 28 may be omitted in some embodiments.

A stack 32 of alternating first and second levels (tiers) 34 and 36 is formed over the layer 28. The stack 32 may comprise any suitable number of alternating levels 34 and 36. The levels 34 ultimately become conductive levels of a memory arrangement. There may be any suitable number of the levels 34 to form the desired number of conductive levels. In some embodiments, there may be at least 8, 16, 32, 64, etc., of the levels 34.

The first levels 34 comprise a first material 38. Such first material may comprise any suitable composition(s), and in some embodiments may comprise, consist essentially of, or consist of silicon nitride. The material 38 is subsequently removed and replaced with other materials, and accordingly may be referred to as a sacrificial material.

The second levels 36 comprise an insulative second material 40, and may be referred to as insulative second levels. The material 40 may comprise any suitable composition(s). In some embodiments, the material 40 may comprise, consist essentially of, or consist of silicon dioxide.

The levels 34 and 36 may be of any suitable thicknesses; and may be the same thickness as one another, or may be different thicknesses relative to one another. In some embodiments, the levels 34 and 36 may have vertical thicknesses within a range of from about 10 nm to about 400 nm.

Figure 7:
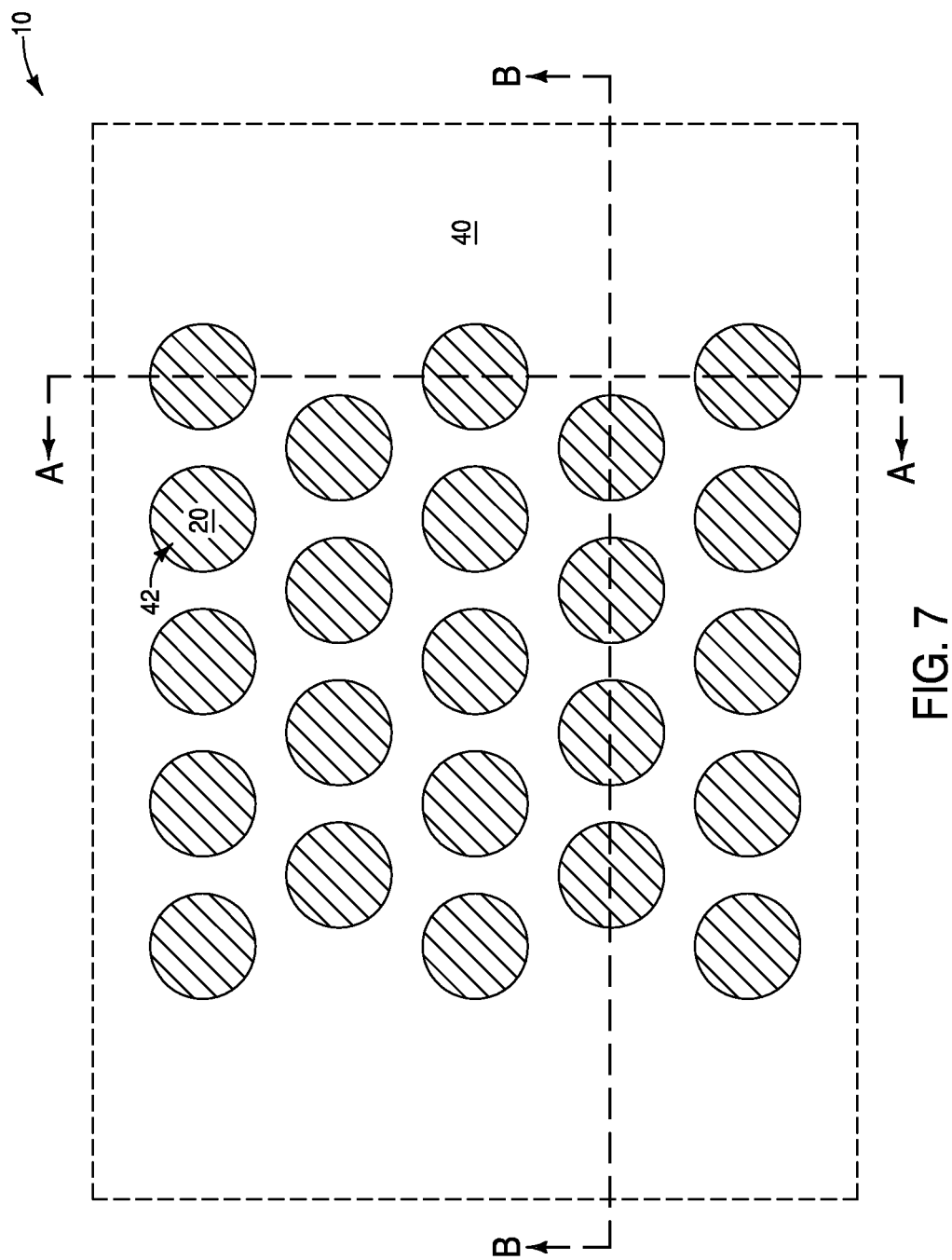
Figure 7:
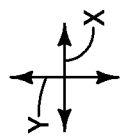
Figure 7A:
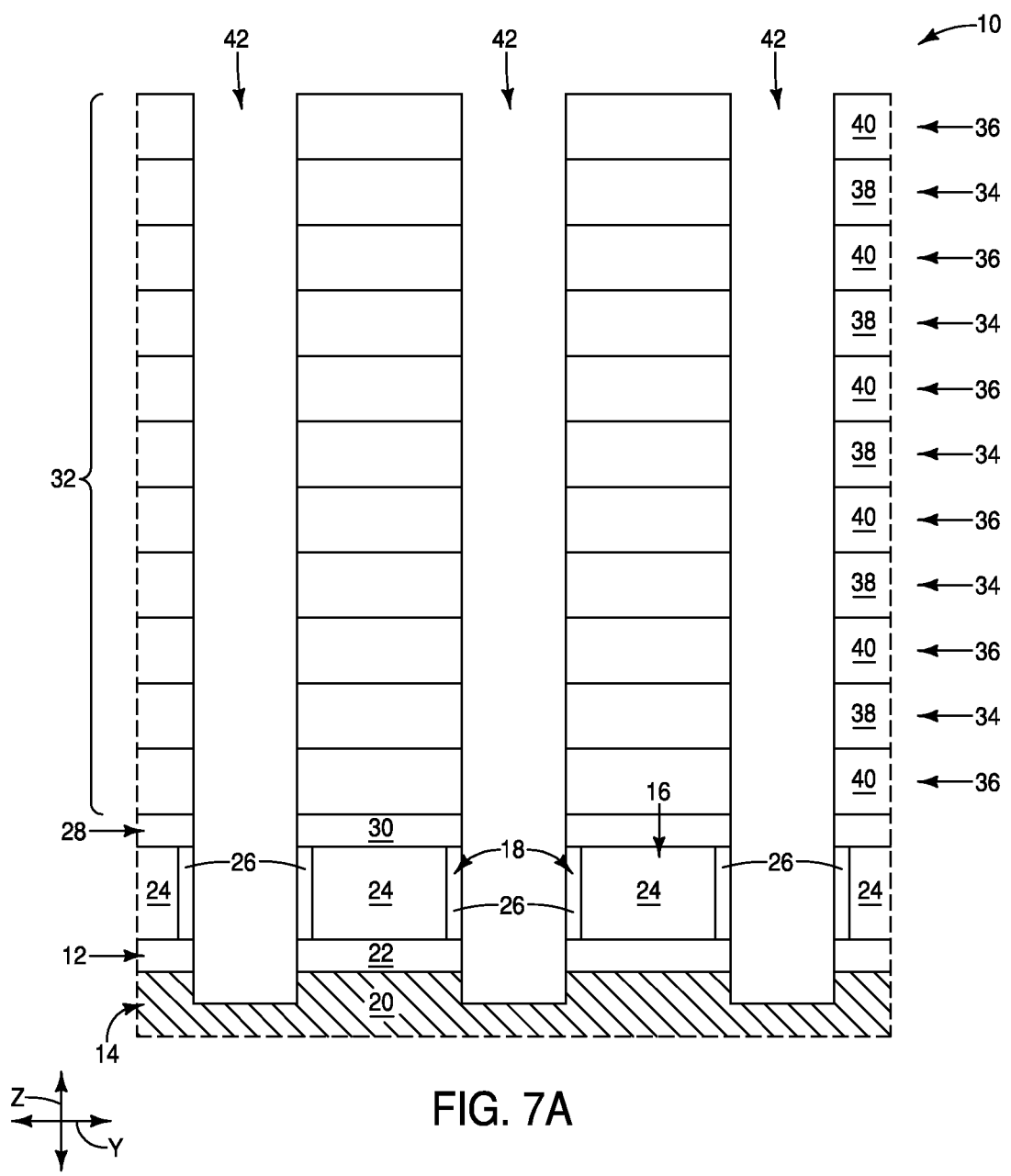
Figure 7B:
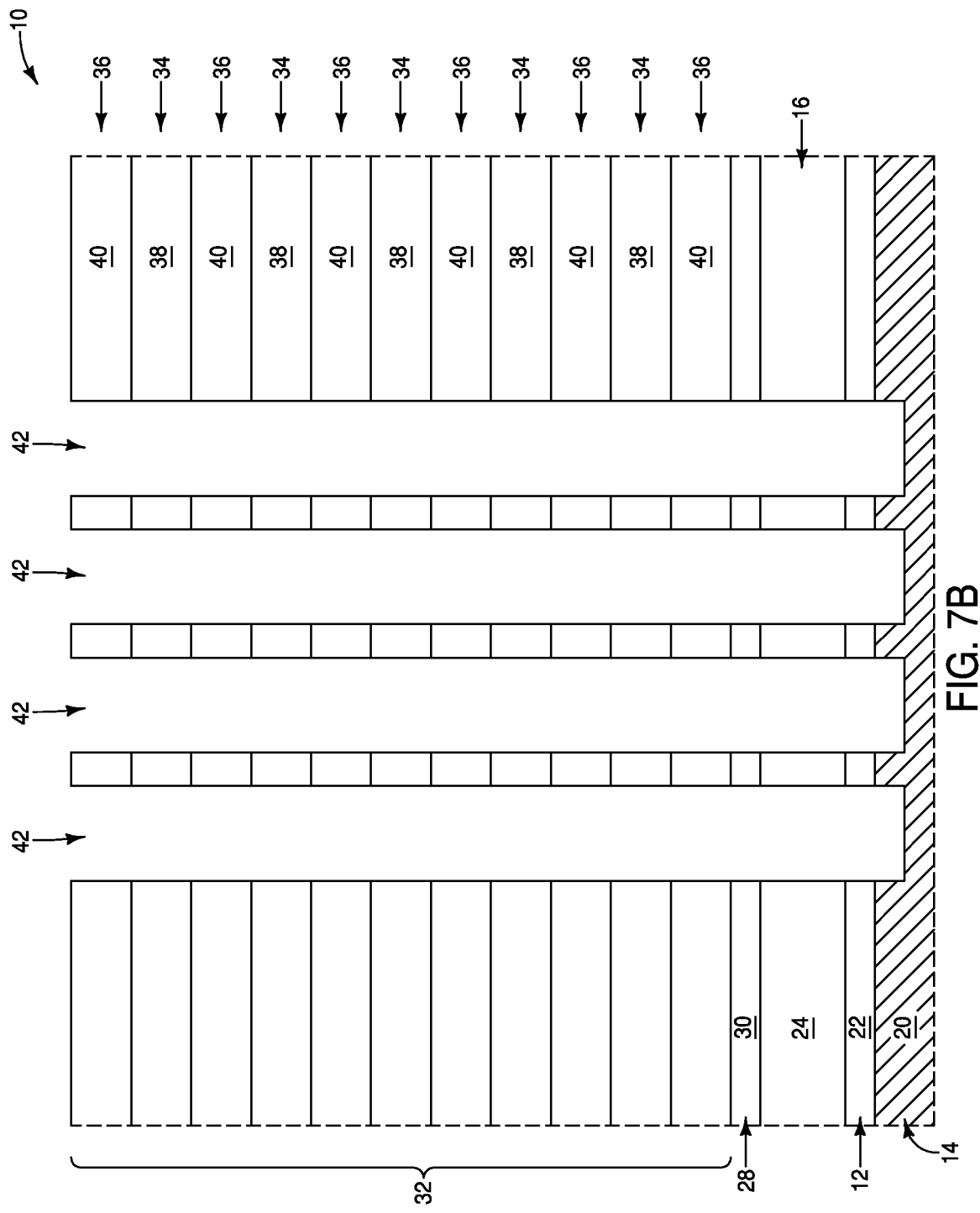

Referring to FIGS. 7-7B, openings (first openings, cell-material-openings) 42 are formed to extend through the stack 32 and through at least some of the strips 16 and 18 to an upper surface of the conductive material 20. The openings 42 may be formed in a tightly-packed arrangement, such as, for example, a hexagonal-close-packed (HCP) arrangement. The openings 42 may or may not penetrate into the conductive material 20.

The openings 42 have sidewall surfaces which extend along the materials 38 and 40 of the stack 32. In the shown embodiment, such sidewall surfaces are substantially vertically straight, with the term "substantially vertically straight" meaning vertically straight to within reasonable tolerances of fabrication and measurement. In other embodiments, the sidewall surfaces of the openings 42 may be tapered.

Figure 8:
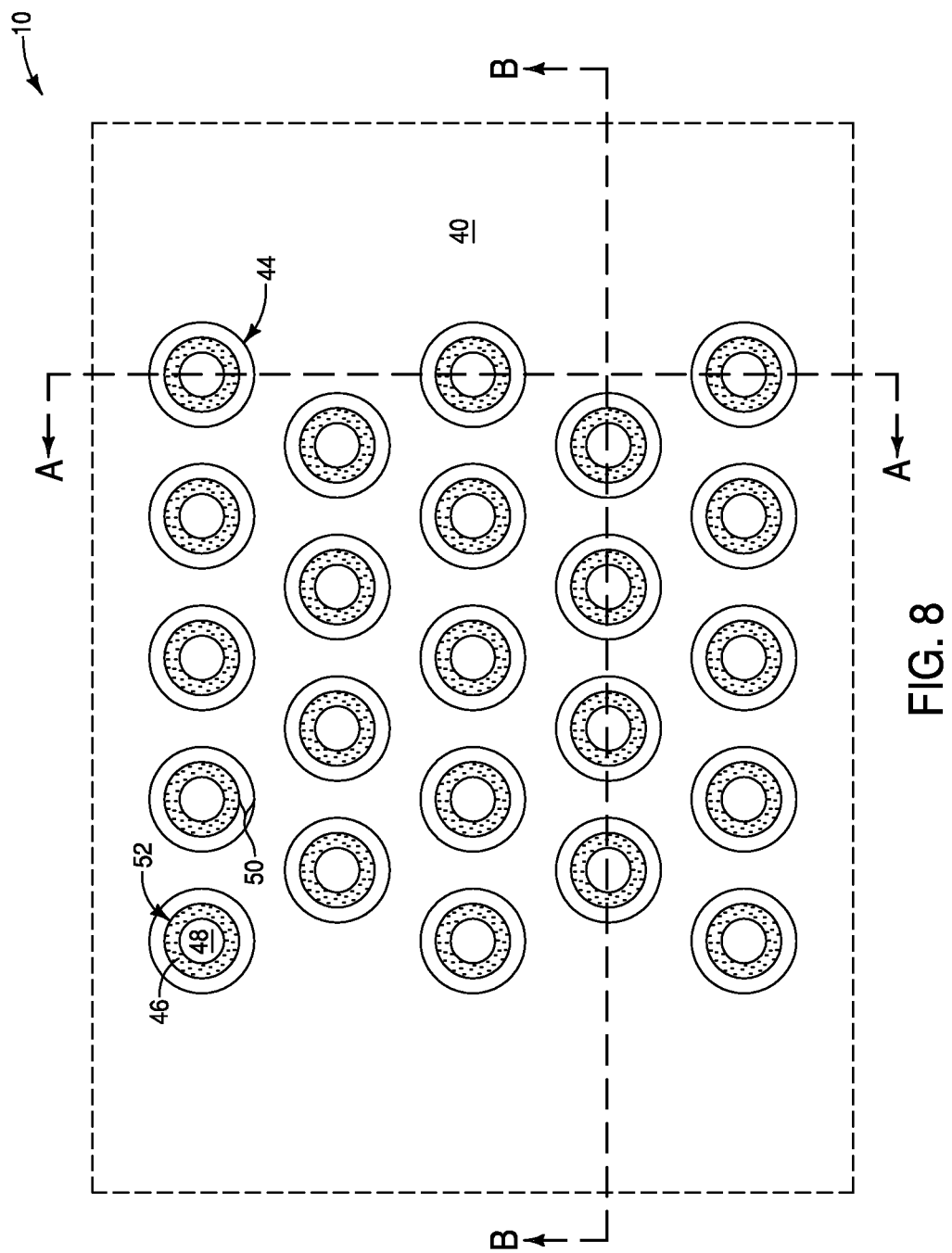
Figure 8:
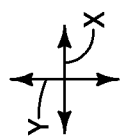
Figure 8A:
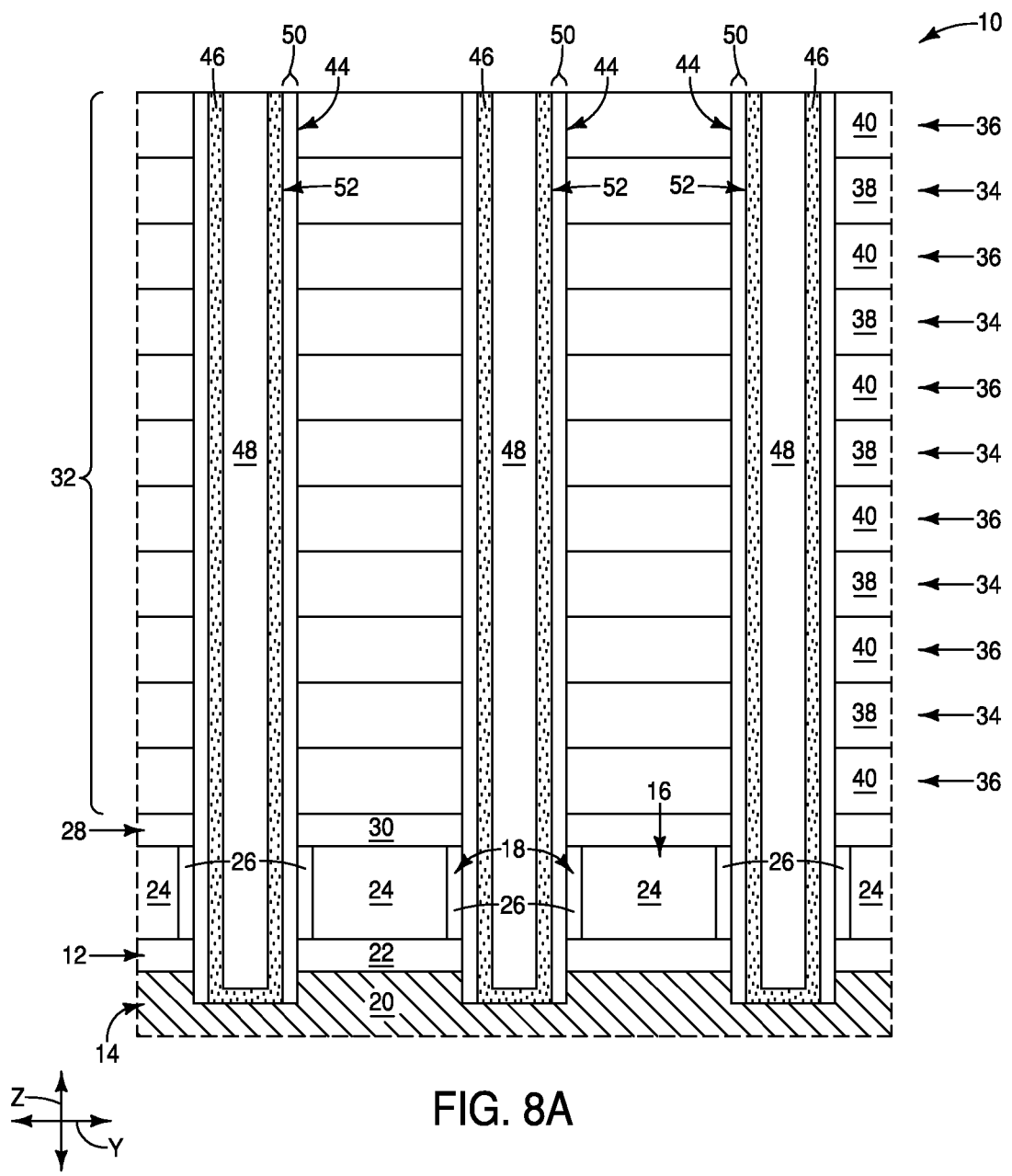
Figure 8B:
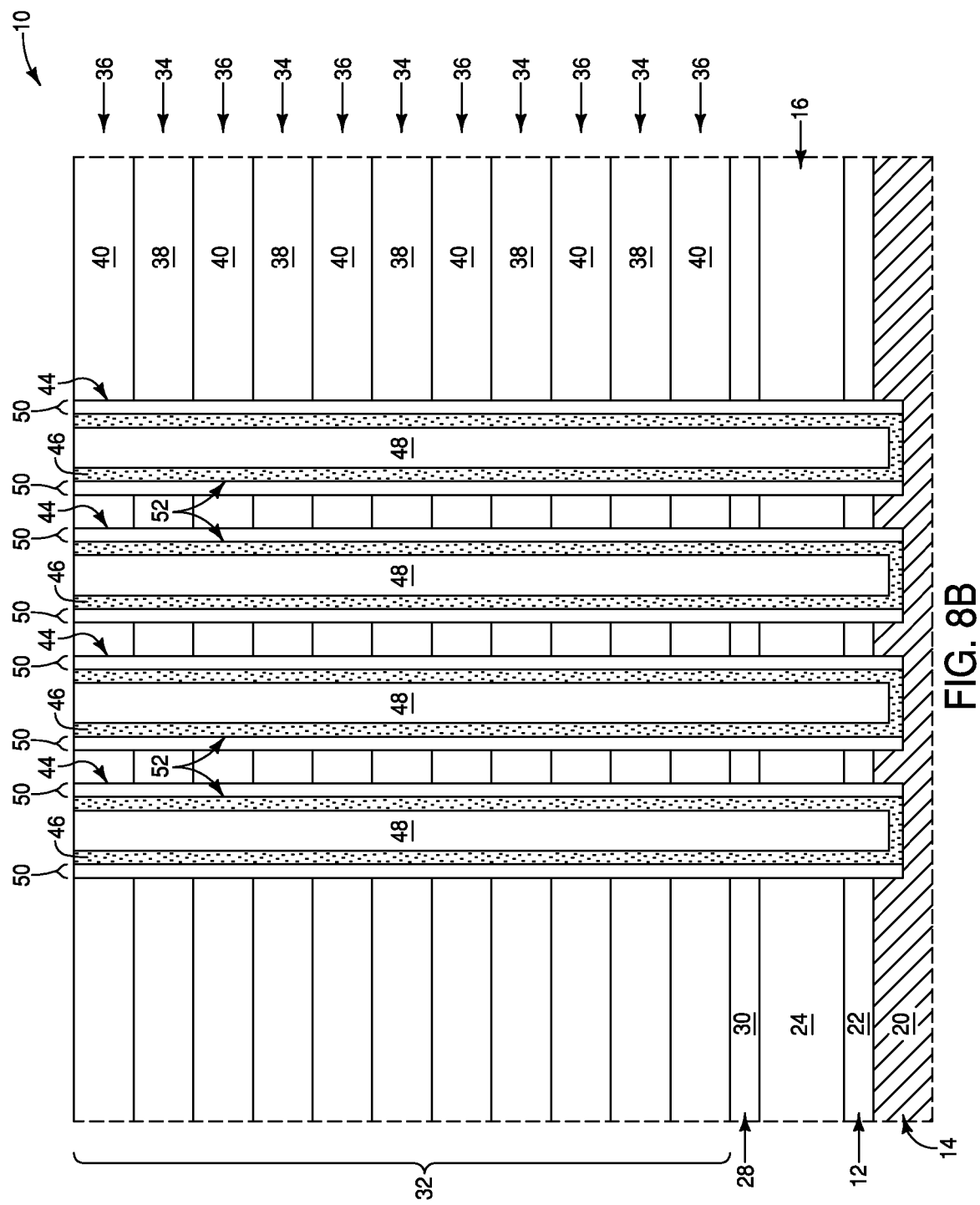

Referring to FIGS. 8-8B, cell-material-pillars 44 are formed within the openings 42 (FIGS. 7-7B). Each of the pillars 44 includes semiconductor material (channel material) 46, dielectric material 48 on one side of the semiconductor material 46, and a region 50 on an opposing side of the semiconductor material 46. The semiconductor material 46 is shown with stippling to assist the reader in identifying such material.

The semiconductor material 46 may comprise any suitable composition(s); and in some embodiments may comprise, consist essentially of, or consist of one or more of silicon, germanium, III/V semiconductor material (e.g., gallium phosphide), semiconductor oxide (e.g., indium gallium zinc oxide), etc. In some embodiments, the semiconductor material 46 may comprise, consist essentially of, or consist of appropriately-doped silicon. The semiconductor material (channel material) 46 forms channel-material-pillars 52.

In the illustrated embodiment, the channel-material-pillars 52 are configured as annular rings (as shown in a top-down view of FIG. 8), with such annular rings surrounding the insulative material 48. Such configuration of the channel-material-pillars may be considered to correspond to a "hollow" channel configuration, with the dielectric material 48 being provided within the hollows of the channel-material-pillars. In other embodiments, the channel material may be configured as solid pillars, rather than being configured as the illustrated hollow pillars.

The insulative material 48 may comprise any suitable composition(s), and in some embodiments may comprise, consist essentially of, or consist of silicon dioxide.

The regions 50 comprise one or more cell materials (memory cell materials), with such cell materials typically being formed within the openings 42 (FIGS. 7-7B) prior to the channel material 46. The cell materials of the regions 50 may comprise tunneling material, charge-storage material and charge-blocking material. The tunneling material (also referred to as gate-dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc.

In some embodiments, the channel material 46 may be referred to as a first cell material, and the cell materials within the regions 50 may be referred to as additional cell materials.

Figure 9:
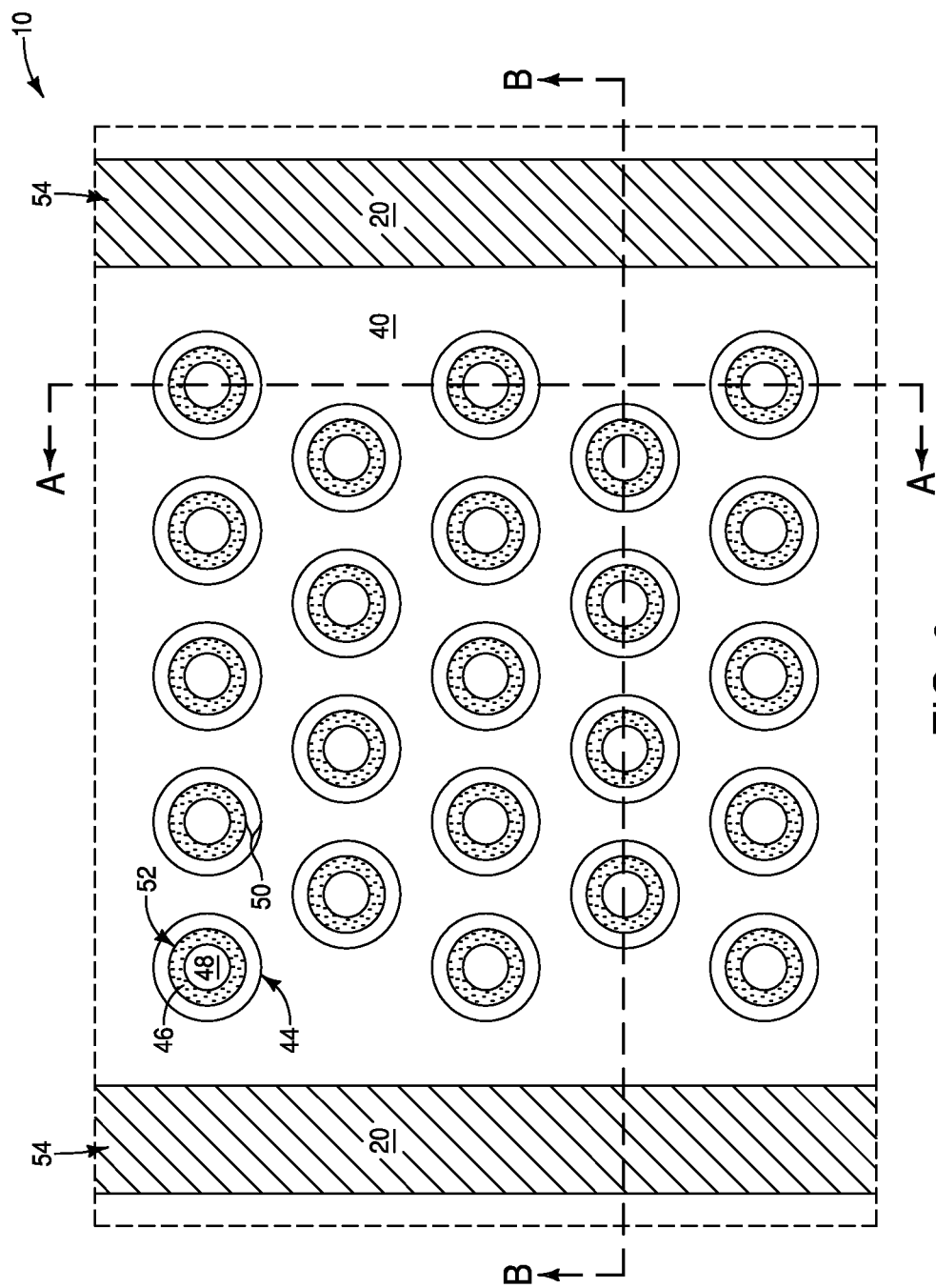
Figure 9A:
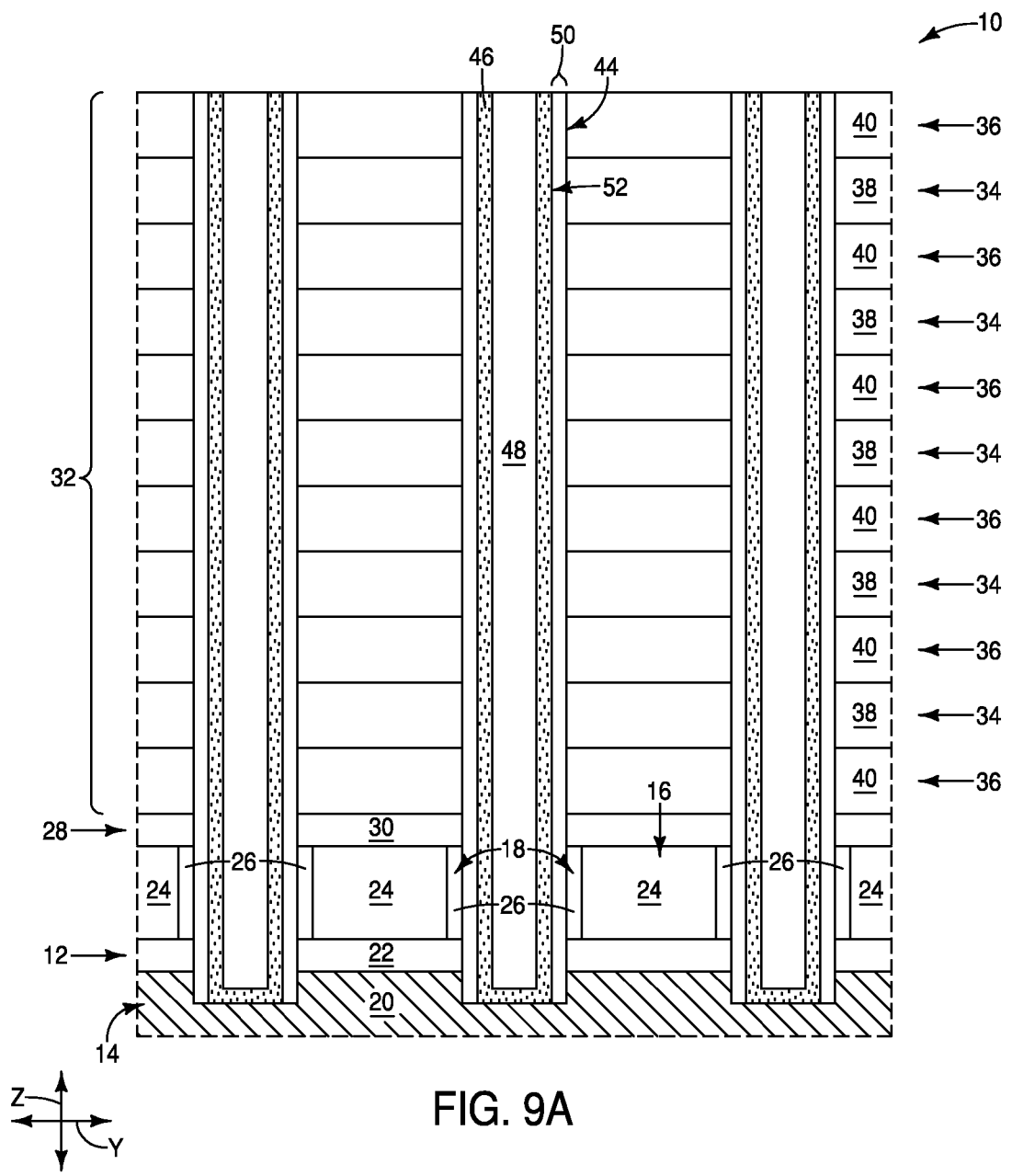
Figure 9B:
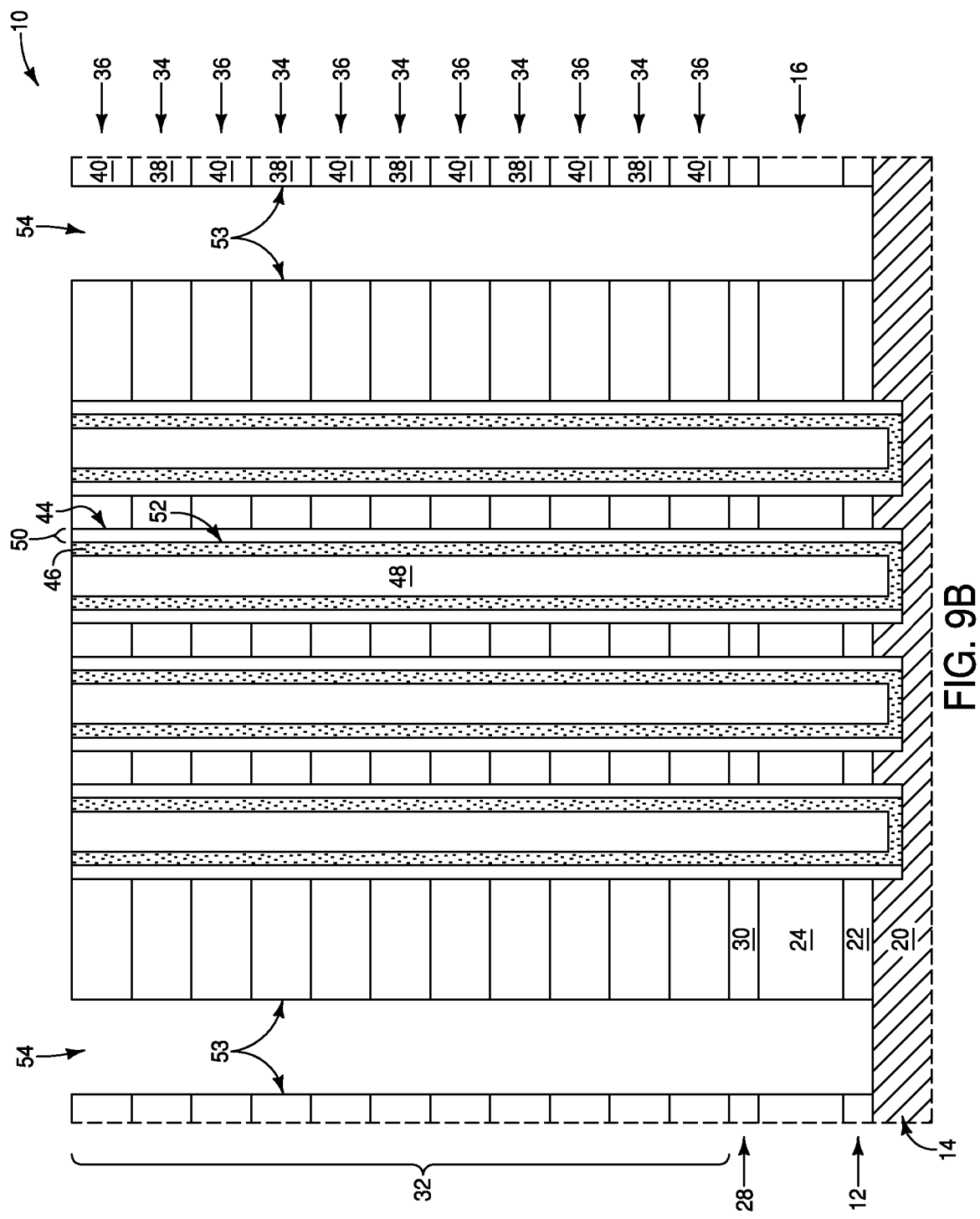

Referring to FIGS. 9-9B, slits (second openings) 54 are formed to pass through the stack 32, through the materials 24 and 26 of the strips 16 and 18, and to the conductive expanse 14. The slits 54 may or may not penetrate into the material 20 of the conductive expanse 14.

In some embodiments, the first openings 42 are cylindrical openings (as may be understood with reference to the top-down view of FIG. 7, and the top-down view of FIG. 9), and the slits 54 are trenches which extend along the illustrated y-axis direction (as may be understood with reference to the top-down view of FIG. 9).

In some embodiments, the strips 16 and 18 may be considered to extend along a first direction (the x-axis direction, as may be understood with reference to the top-down view of FIG. 5), and the slits 54 may be considered to extend along a second direction (the y-axis direction, as may be understood with reference to the top-down view of FIG. 9). The second direction crosses the first direction, and in the illustrated embodiment is substantially orthogonal to the first direction (with the term "substantially orthogonal" meaning orthogonal to within reasonable tolerances of fabrication and measurement).

The slits 54 have sidewall surfaces 53 which extend along the materials 38 and 40 of the stack 32. In the shown embodiment, the sidewall surfaces 53 are substantially vertically straight. In other embodiments, the sidewall surfaces 53 may be tapered.

Figure 10:
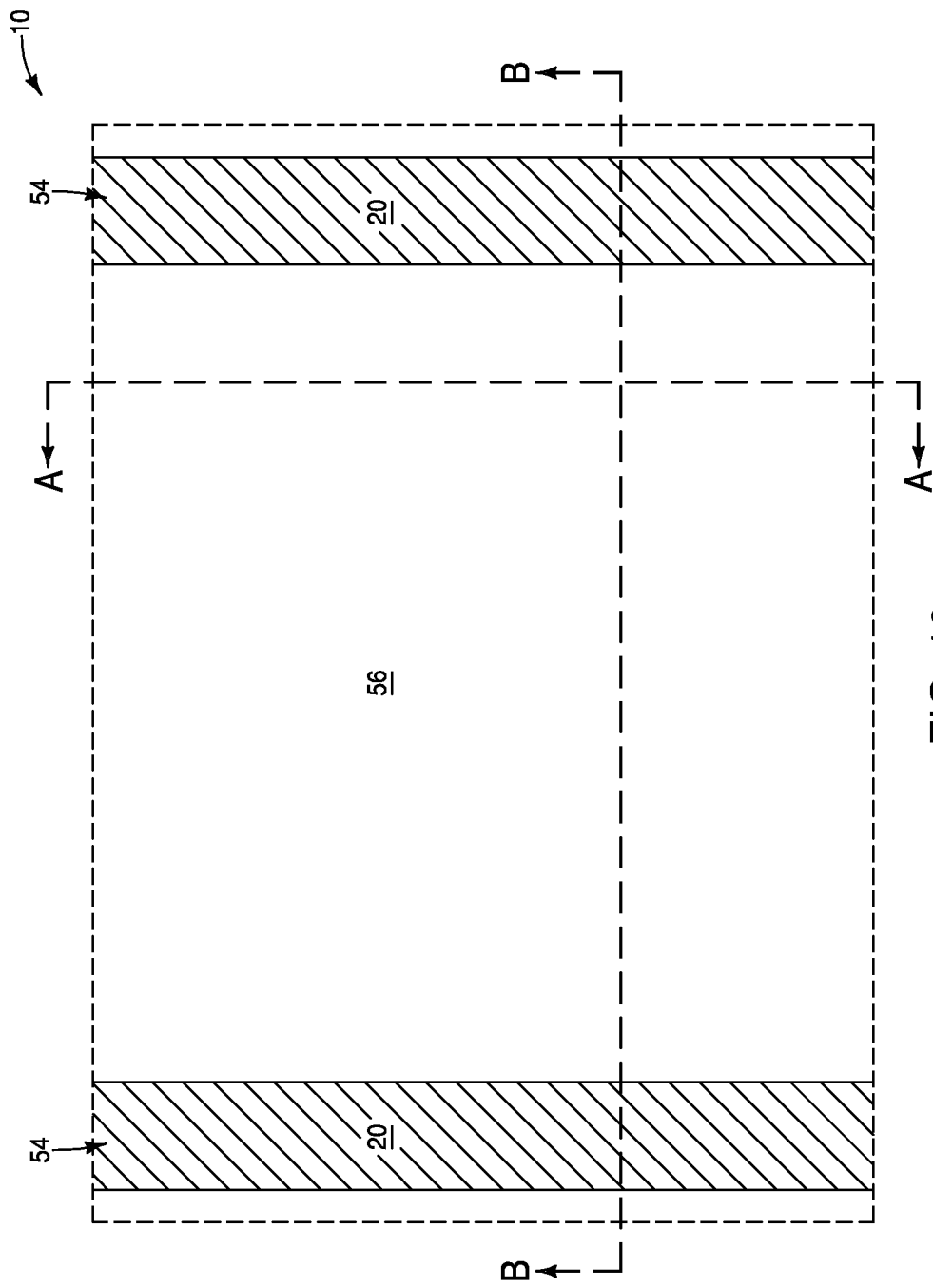
Figure 10A:
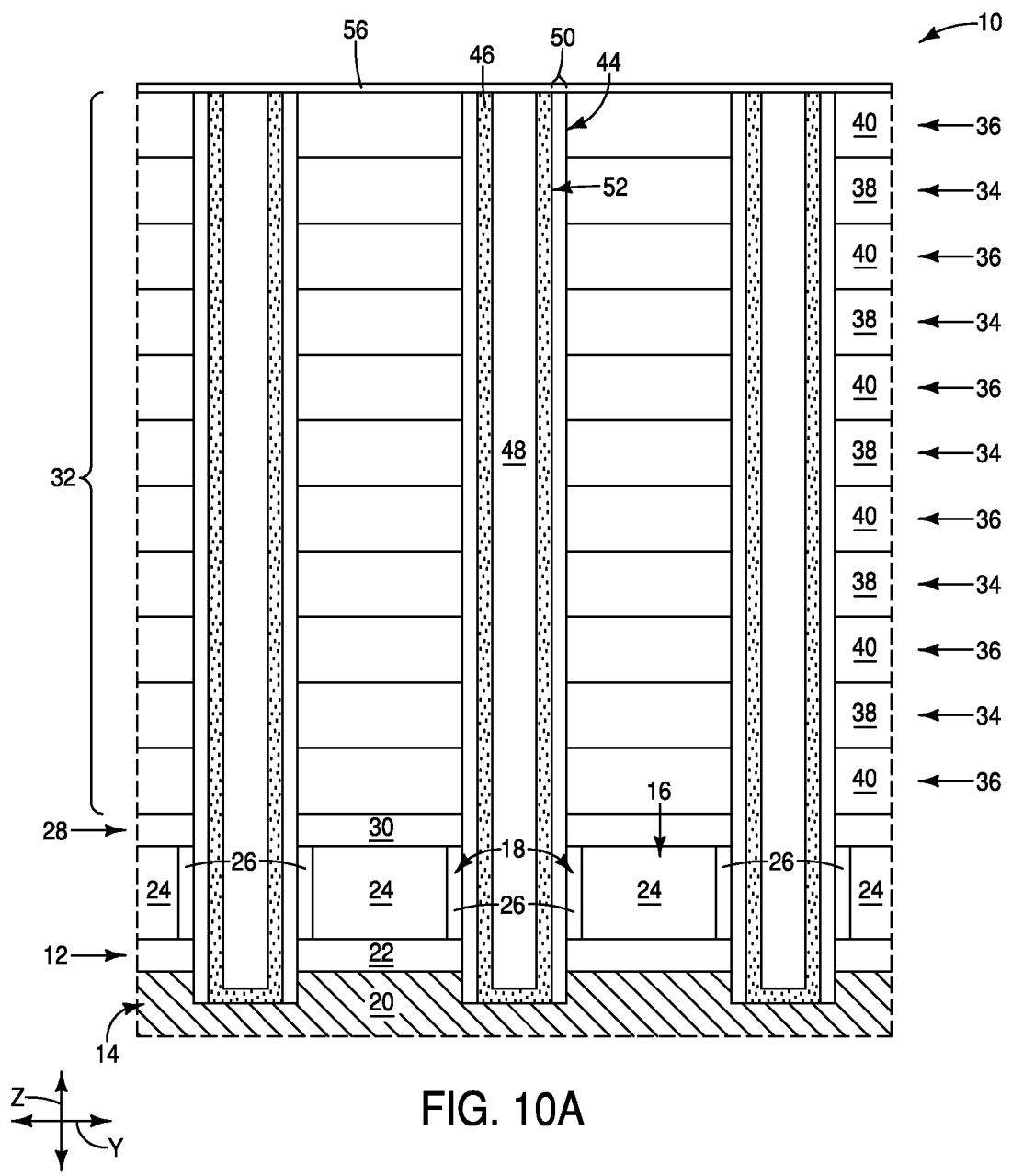
Figure 10B:
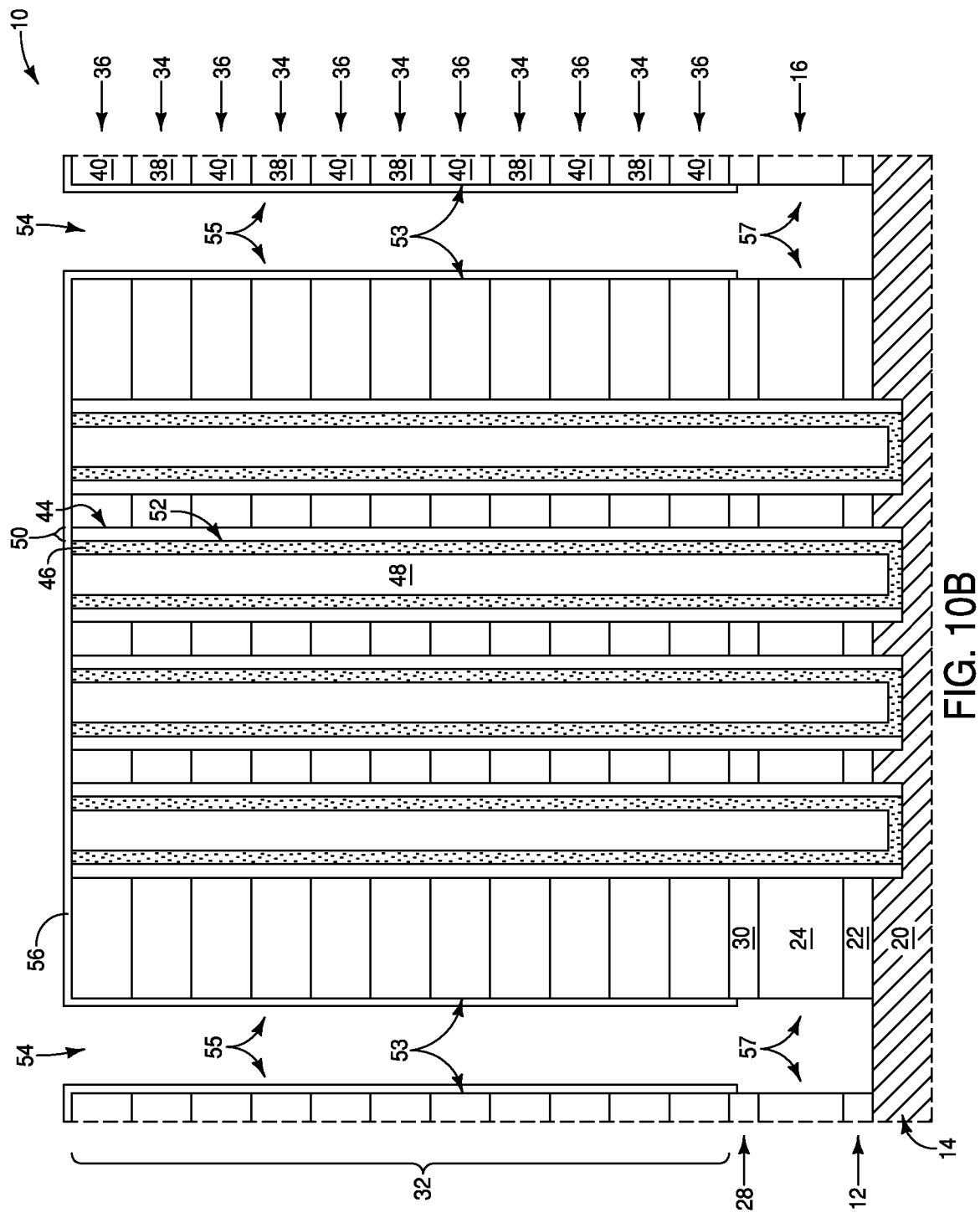

Referring to FIGS. 10-10B, protective material 56 is formed along the sidewall surfaces 53 of the slits 54 to line upper portions 55 of the slits 54 while leaving lower portions 57 of the slits exposed. The exposed lower portions 57 are along the materials 24 and 26 of the strips 16 and 18. In the illustrated embodiment, the protective material 56 also extends across a top of the stack 32.

The protective material 56 may comprise any suitable composition(s). In some embodiments, the protective material 56 may comprise, consist essentially of, or consist of silicon; and specifically may comprise silicon which is effectively undoped (e.g., comprising only an intrinsic dopant concentration, and in some embodiments comprising a dopant concentration of less than or equal to about $10^{16}$ atoms/cm$^3$).

Figure 11:
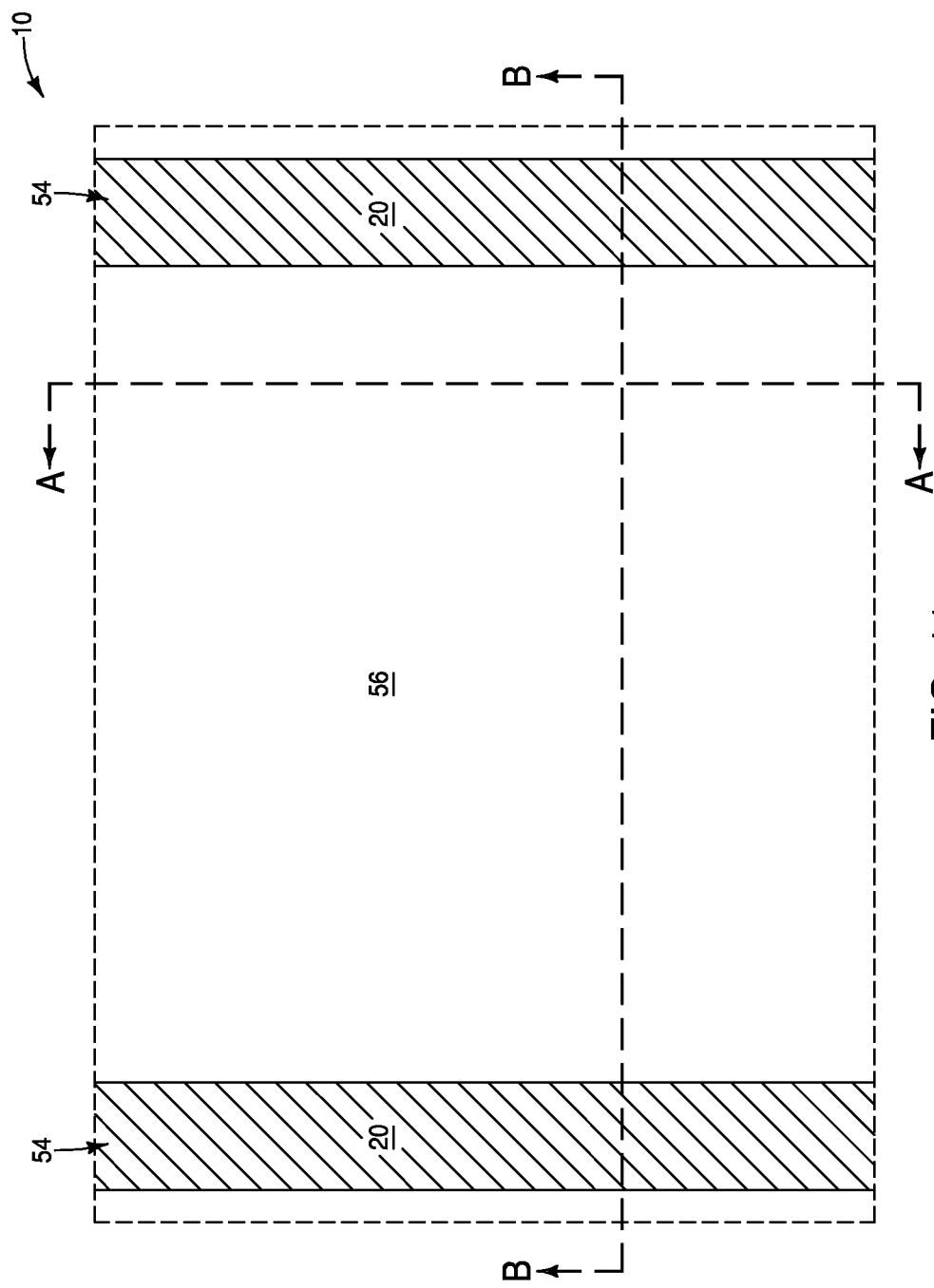
Figure 11A:
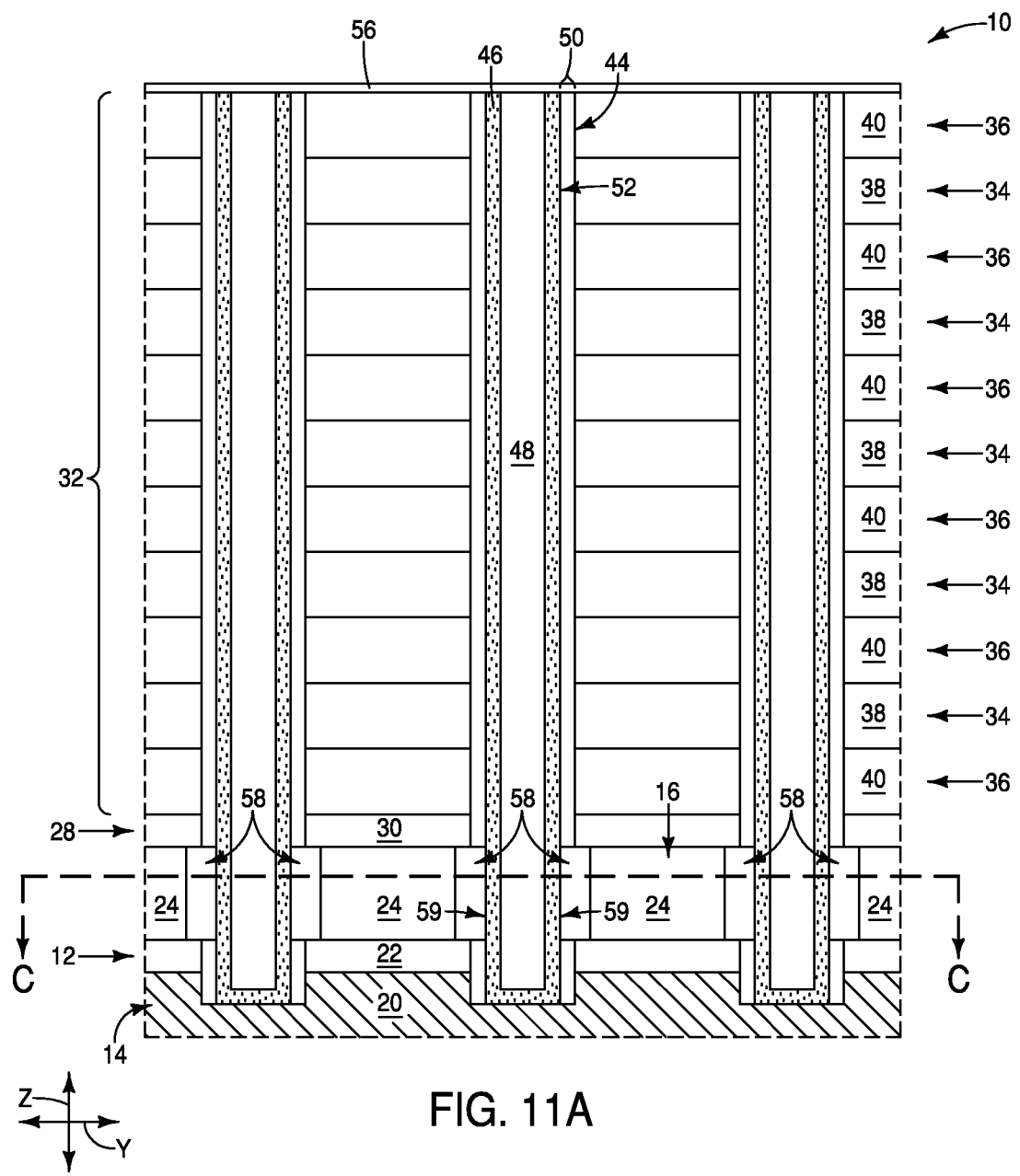
Figure 11B:
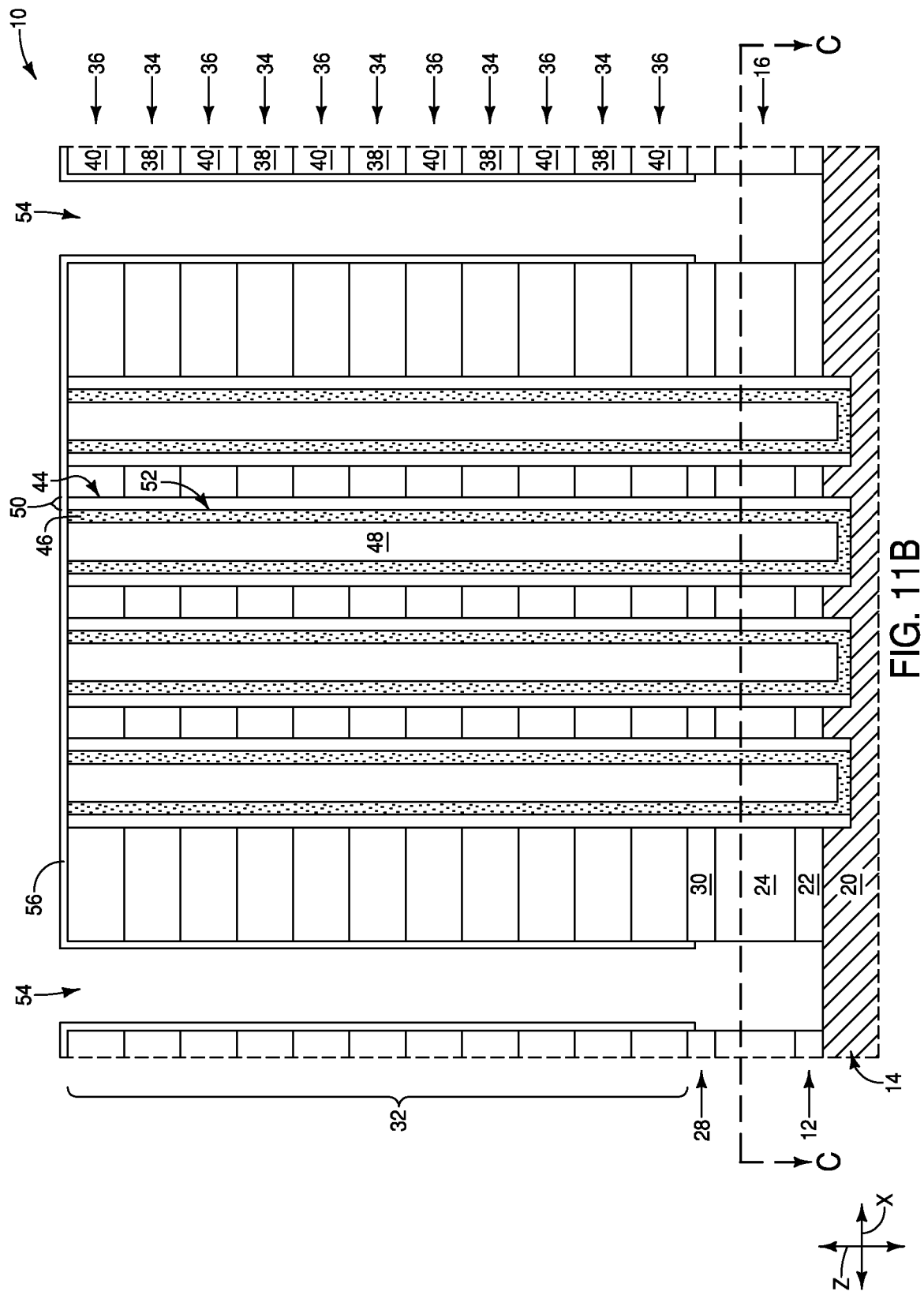
Figure 11C:
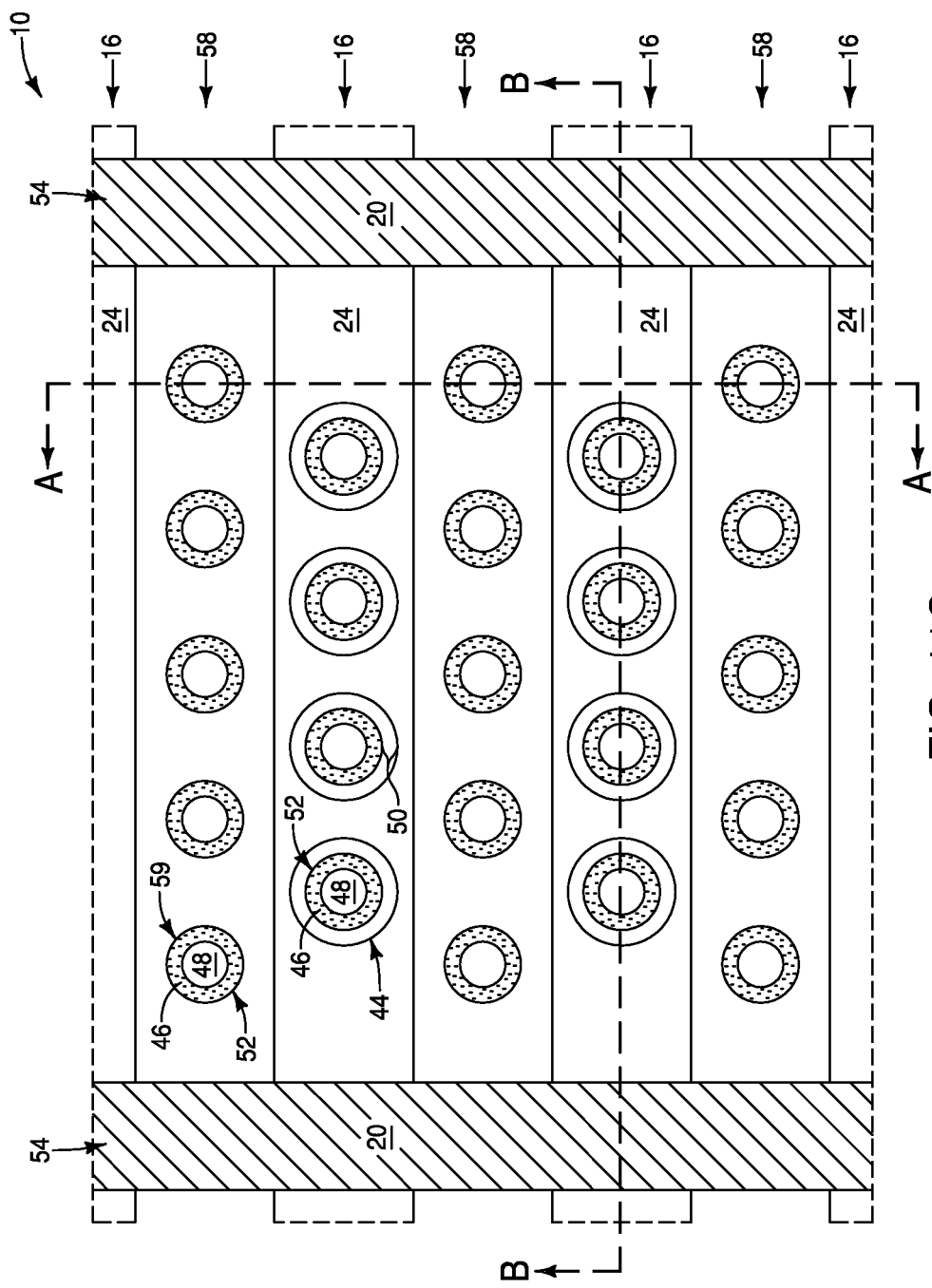

Referring to FIGS. 11-11C, the sacrificial material 26 of the strips 18 (FIGS. 5, 5A and 10A) is selectively removed relative to the materials 20, 22, 24, 30 and 56. Such forms first conduits (first voids) 58 between the first and second layers 12 and 28, and along the strips 16. In the illustrated embodiment, the conduits 58 are extended through the cell materials along lower regions of the cell-material-pillars 44 to expose sidewall surfaces 59 of the semiconductor material (channel material) 46 of the channel-material-pillars 52.

In some embodiments, the sacrificial material 26 may comprise silicon dioxide, and may be removed with a wet etch utilizing hydrofluoric acid. In some embodiments, the sacrificial material 26 may comprise silicon nitride, and may be removed with a wet etch utilizing phosphoric acid.

Figure 12:
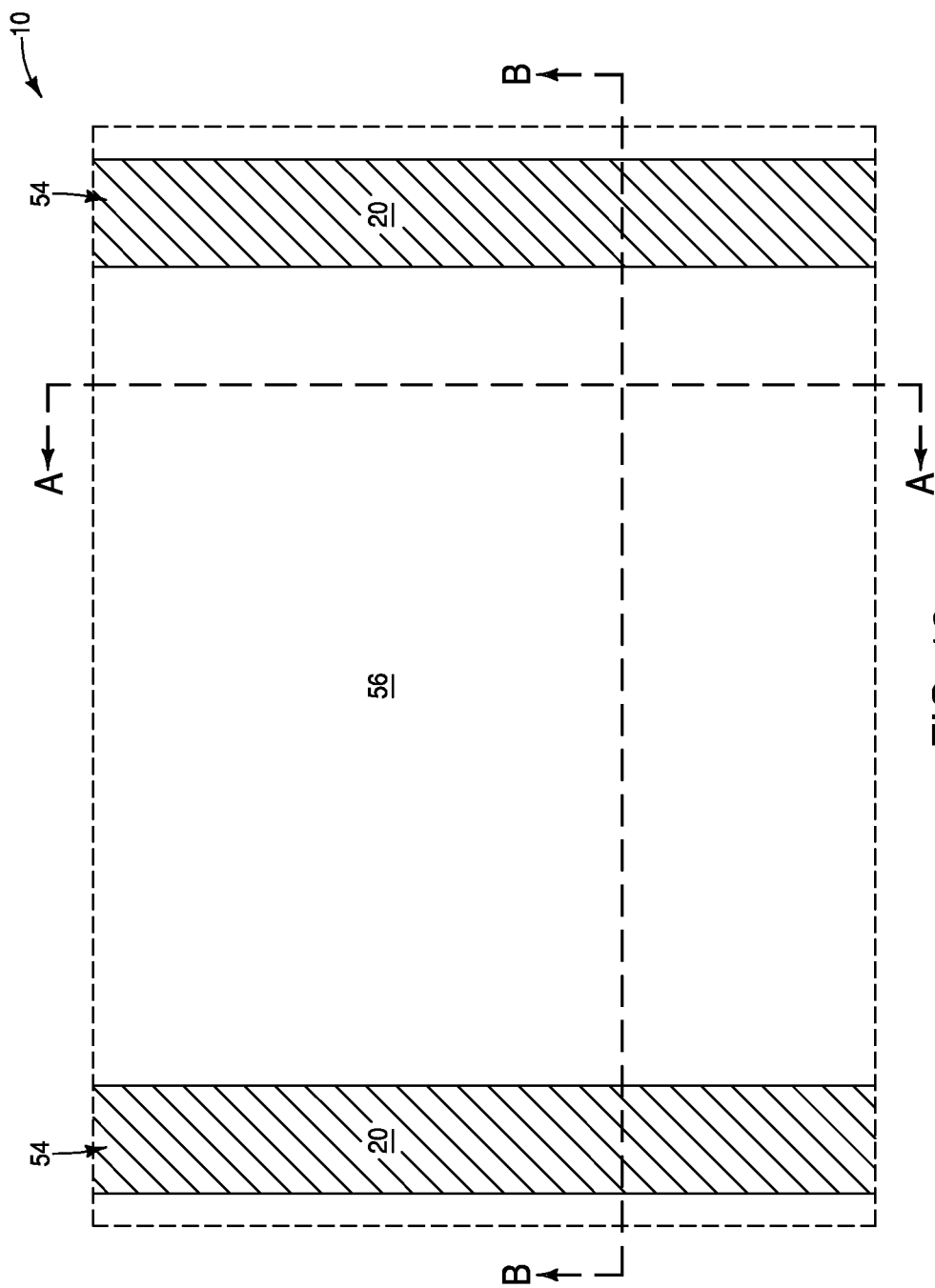
Figure 12:
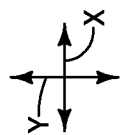
Figure 12A:
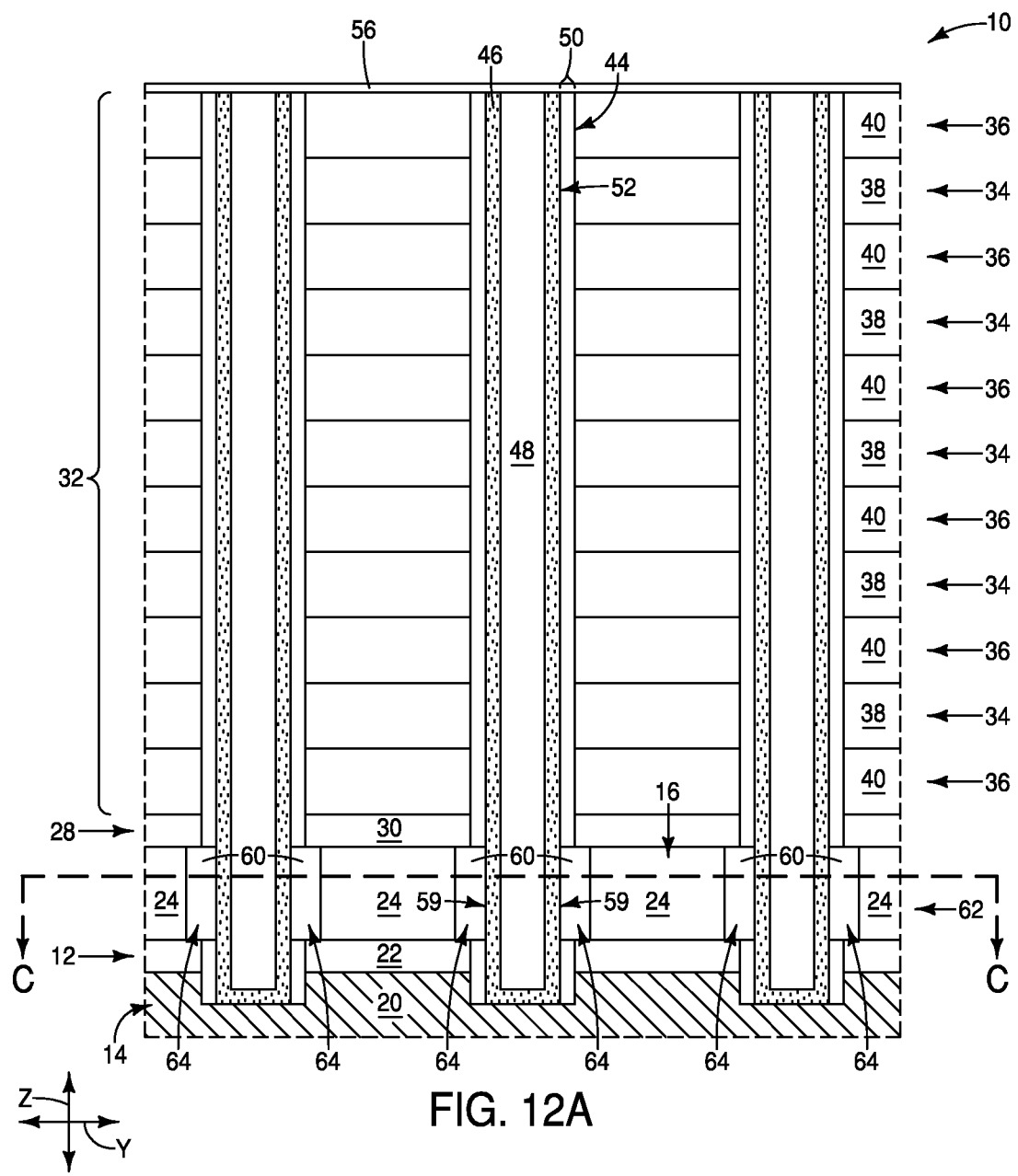
Figure 12B:
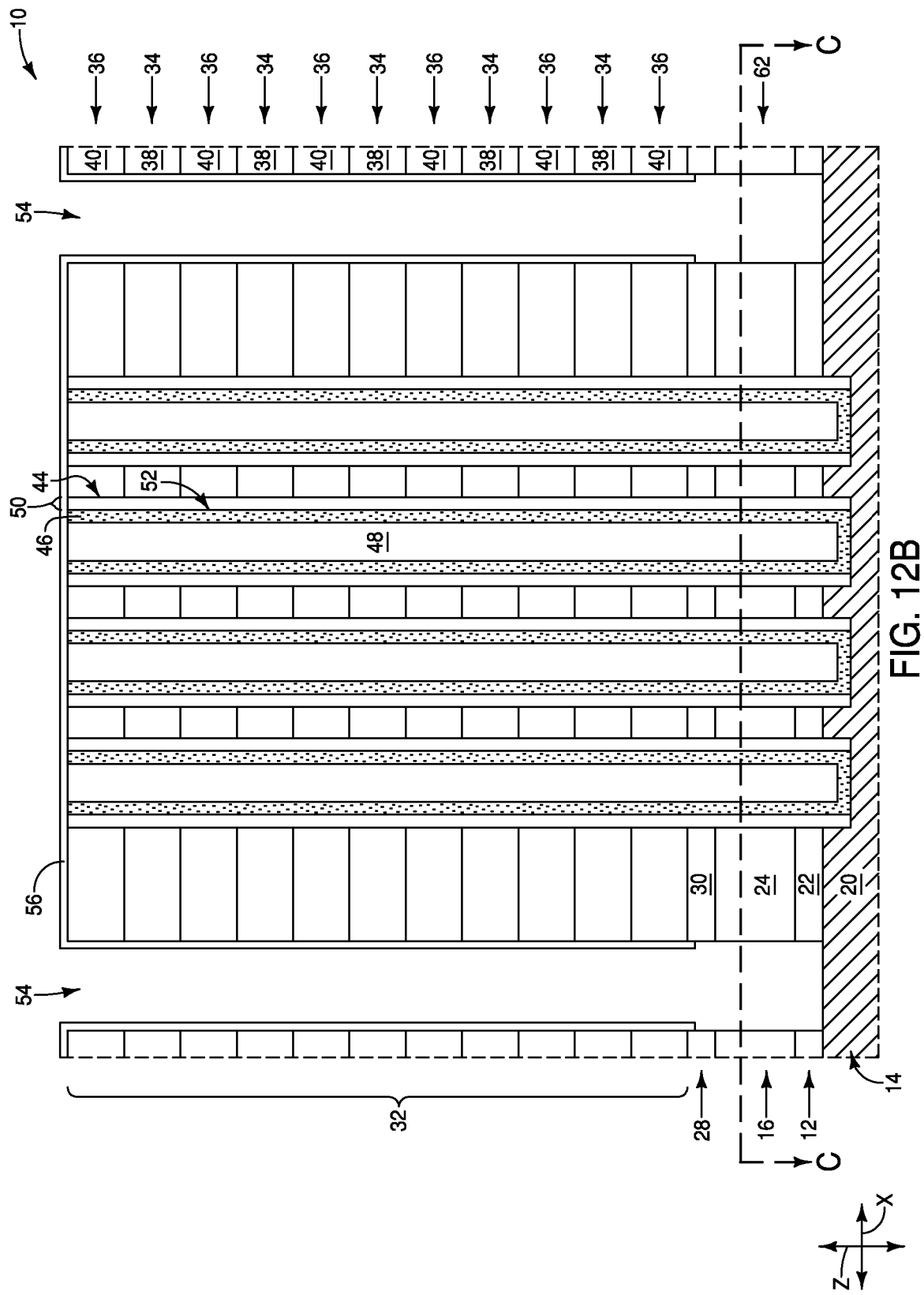
Figure 12C:
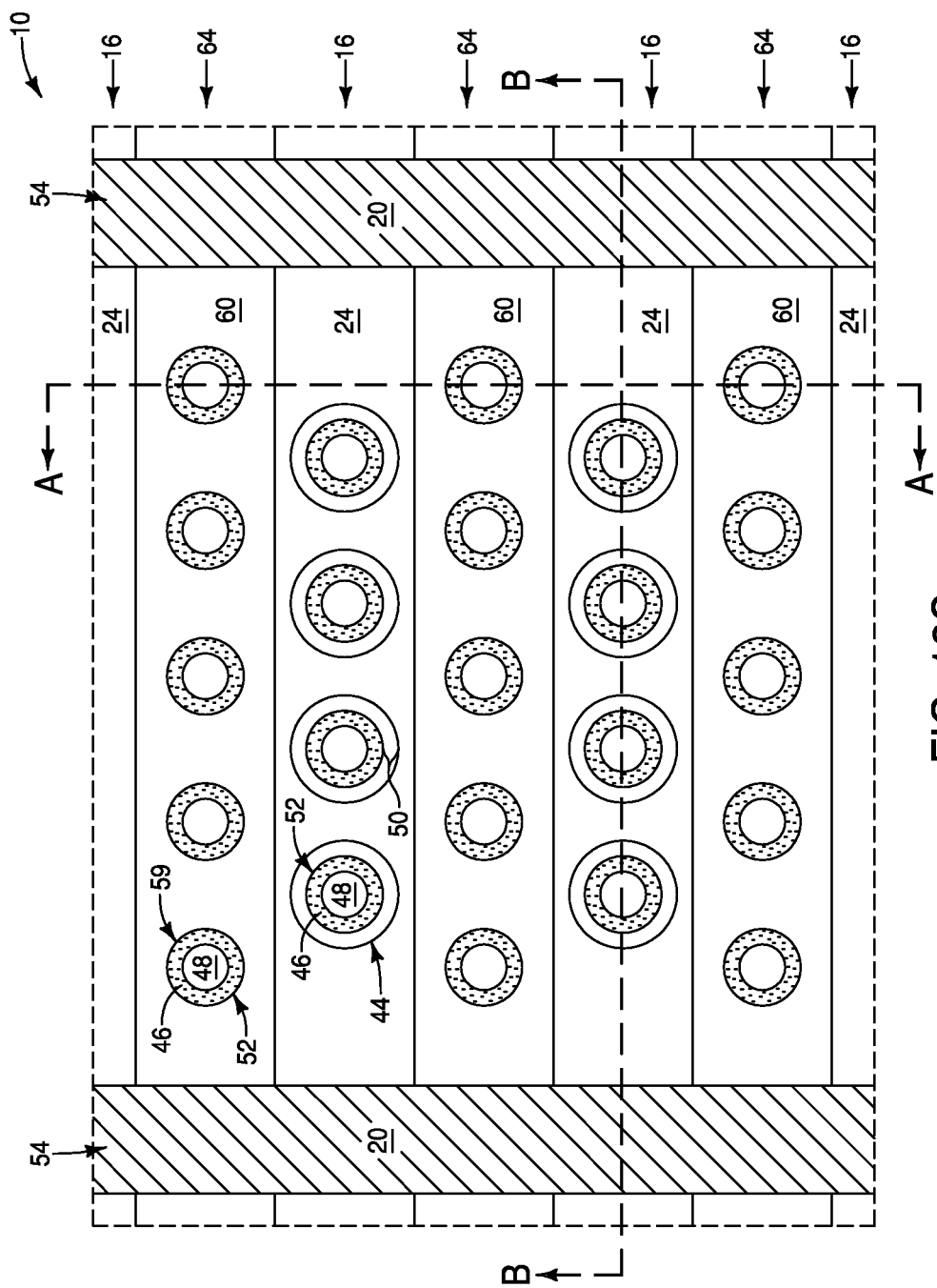

Referring to FIGS. 12-12C, replacement material 60 is formed within the conduits 58 (FIGS. 11-11C). The replacement material 60 may be conductively-doped semiconductor material, and may comprise a same semiconductor material as the channel material 46. In some embodiments, the replacement material 60 may comprise, consist essentially of, or consist of conductively-doped silicon. The replacement material 60 may be a conductive material, and in some embodiments may be referred to as a first conductive material formed within a level 62 of the strips (with such level 62 being labeled in FIGS. 12A and 12B).

The conductive material 60 may be considered to be configured as conductive structures (conductive strips) 64, with such conductive structures extending linearly along the x-axis direction. Although the conductive structures 64 are shown to be straight along the x-axis direction, in other embodiments the structures 64 may be curved, wavy, etc.

In the illustrated embodiment, the replacement material 60 is formed directly against the sidewall surfaces 59 of the lower regions of the channel-material-pillars 52.

The processing of FIGS. 11 and 12 may be considered to replace the sacrificial material 26 (FIG. 10A) with the replacement material 60. In some embodiments, the processing of FIGS. 11 and 12 may be considered to replace a first sacrificial material (26) with a first replacement material (60).

Figure 13A:
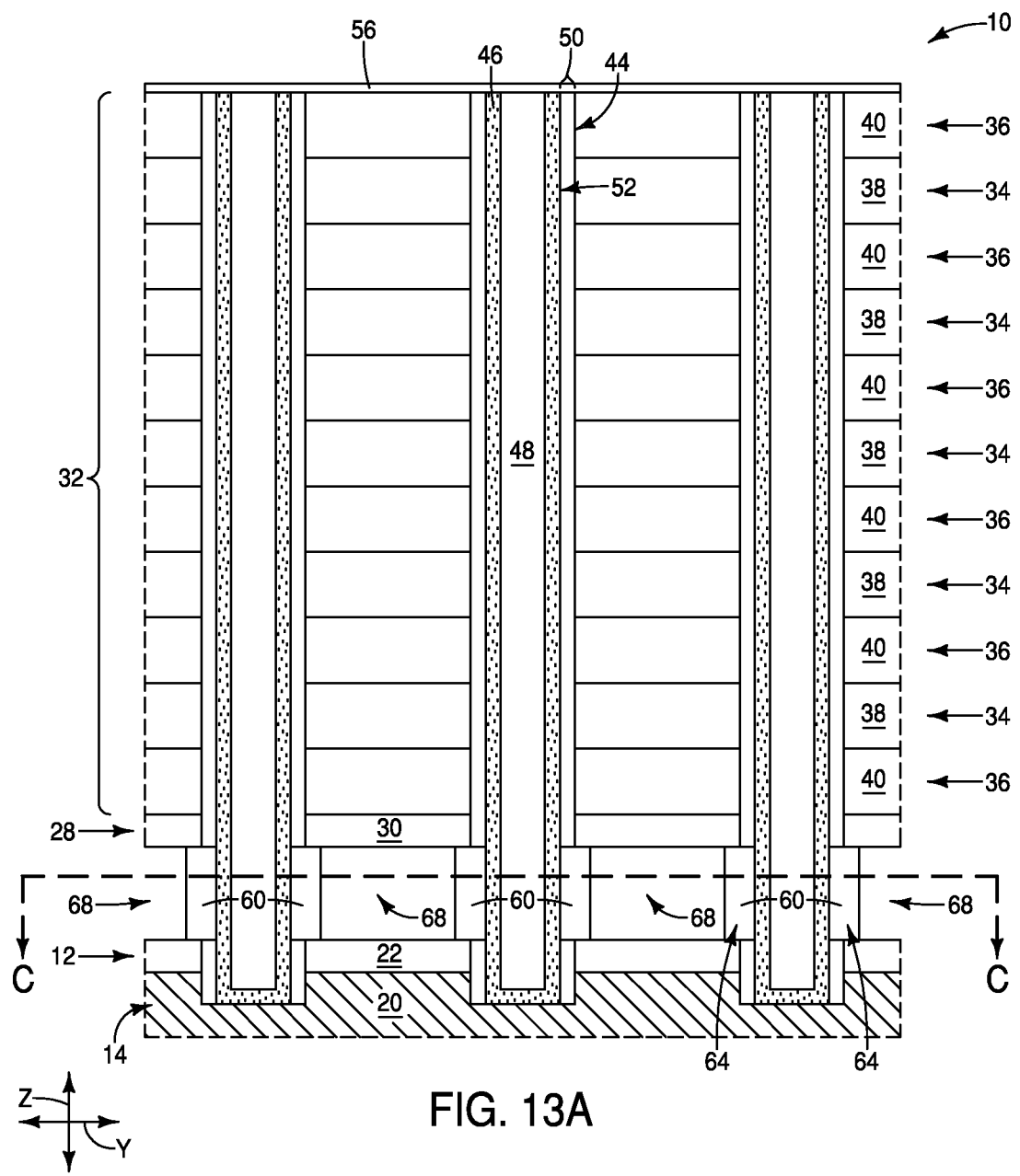
Figure 13B:
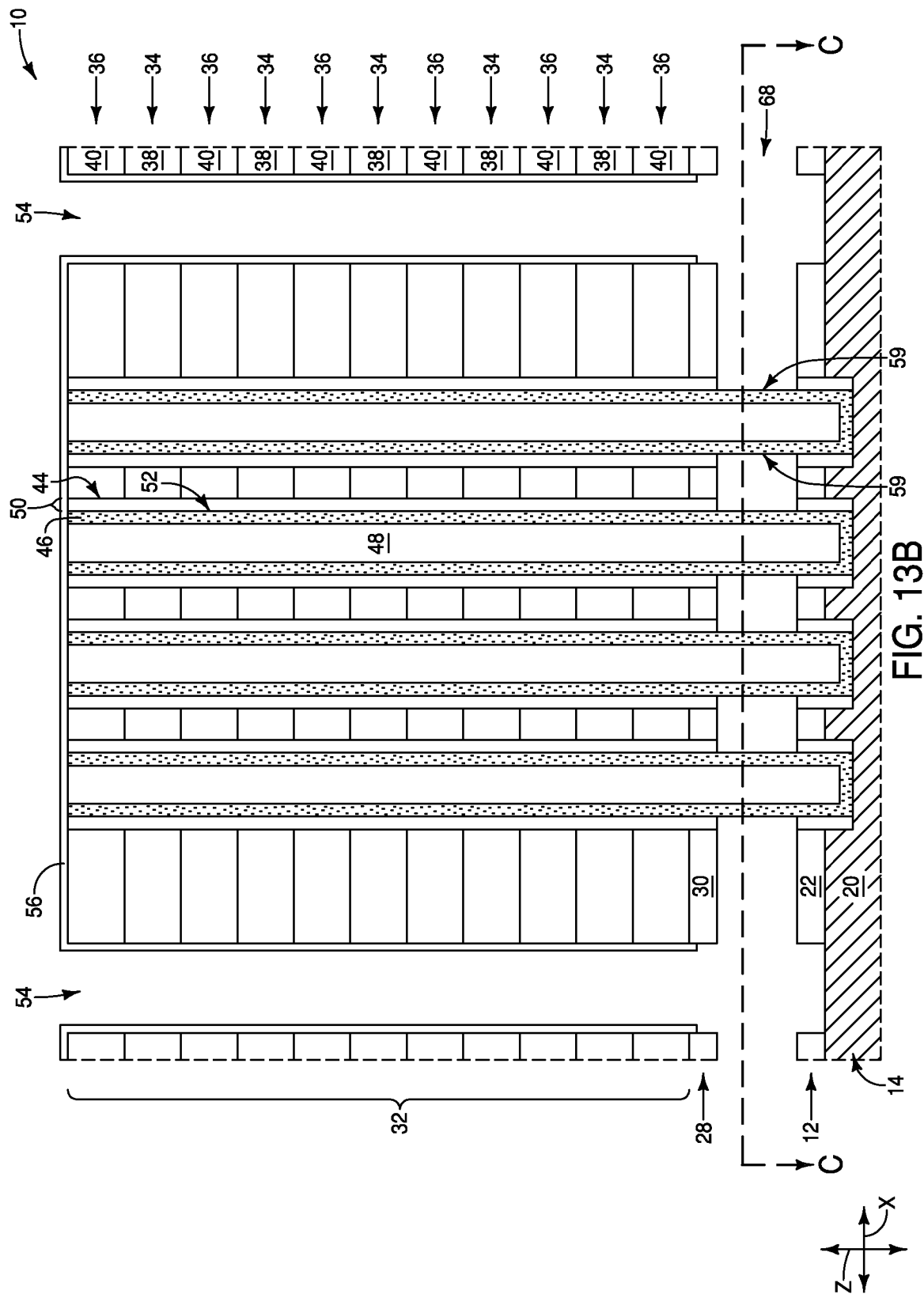
Figure 13C:
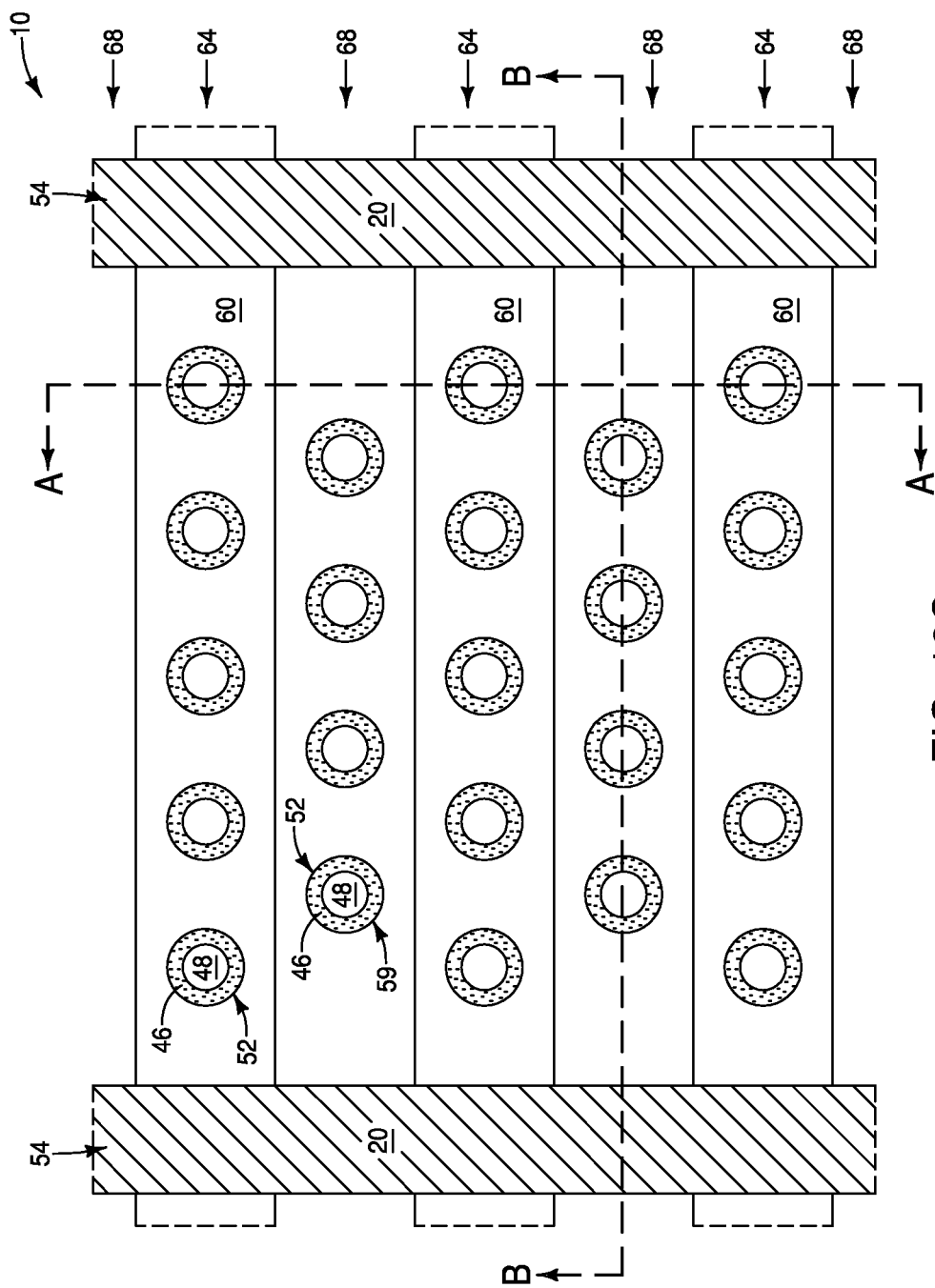

Referring to FIGS. 13-13C, the sacrificial material 24 of the strips 16 (FIGS. 5-5B and 12A-12C) is selectively removed relative to the materials 20, 22, 30, 56 and 60. Such forms second conduits (second voids) 68 between the first and second layers 12 and 28, and along the conductive structures (strips) 64. In the illustrated embodiment, the conduits 68 are extended through the cell materials along lower regions of the cell-material-pillars 44 to expose sidewall surfaces 59 of the semiconductor material (channel material) 46 of the channel-material-pillars 52.

In some embodiments, the sacrificial material 24 may comprise silicon dioxide, and may be removed with a wet etch utilizing hydrofluoric acid. In some embodiments, the sacrificial material 24 may comprise silicon nitride, and may be removed with a wet etch utilizing phosphoric acid.

Figure 14:
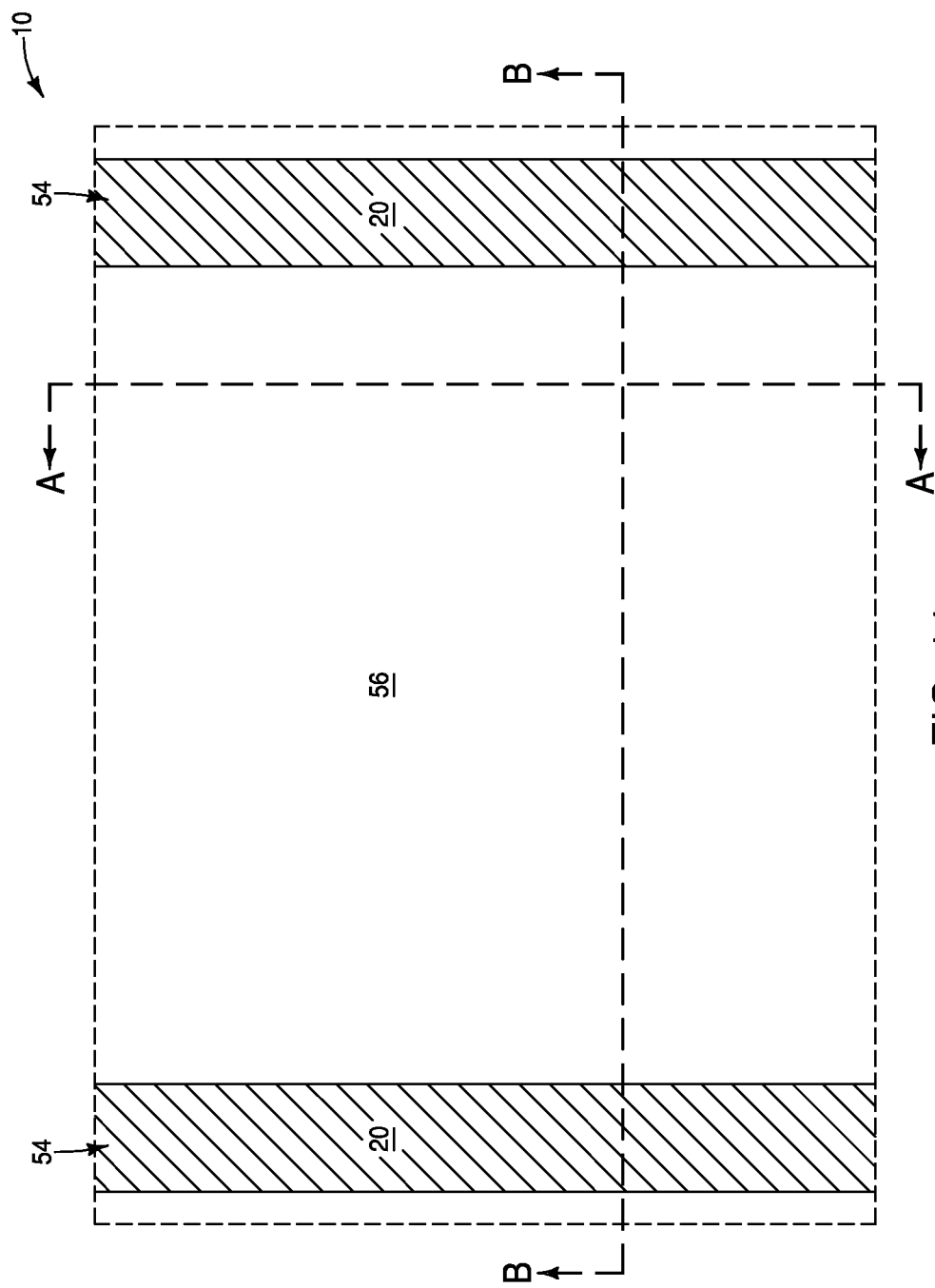
Figure 14A:
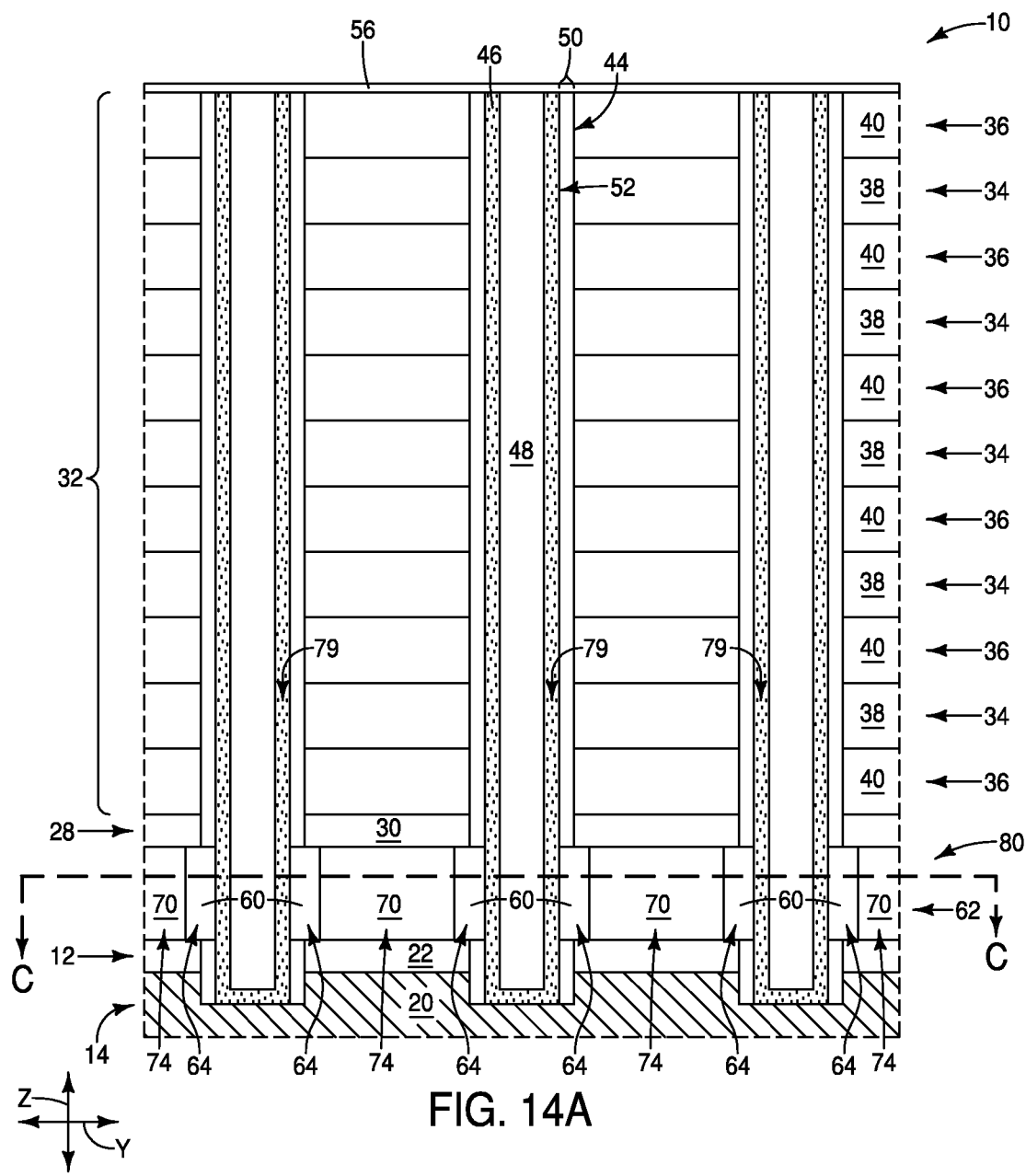
Figure 14B:
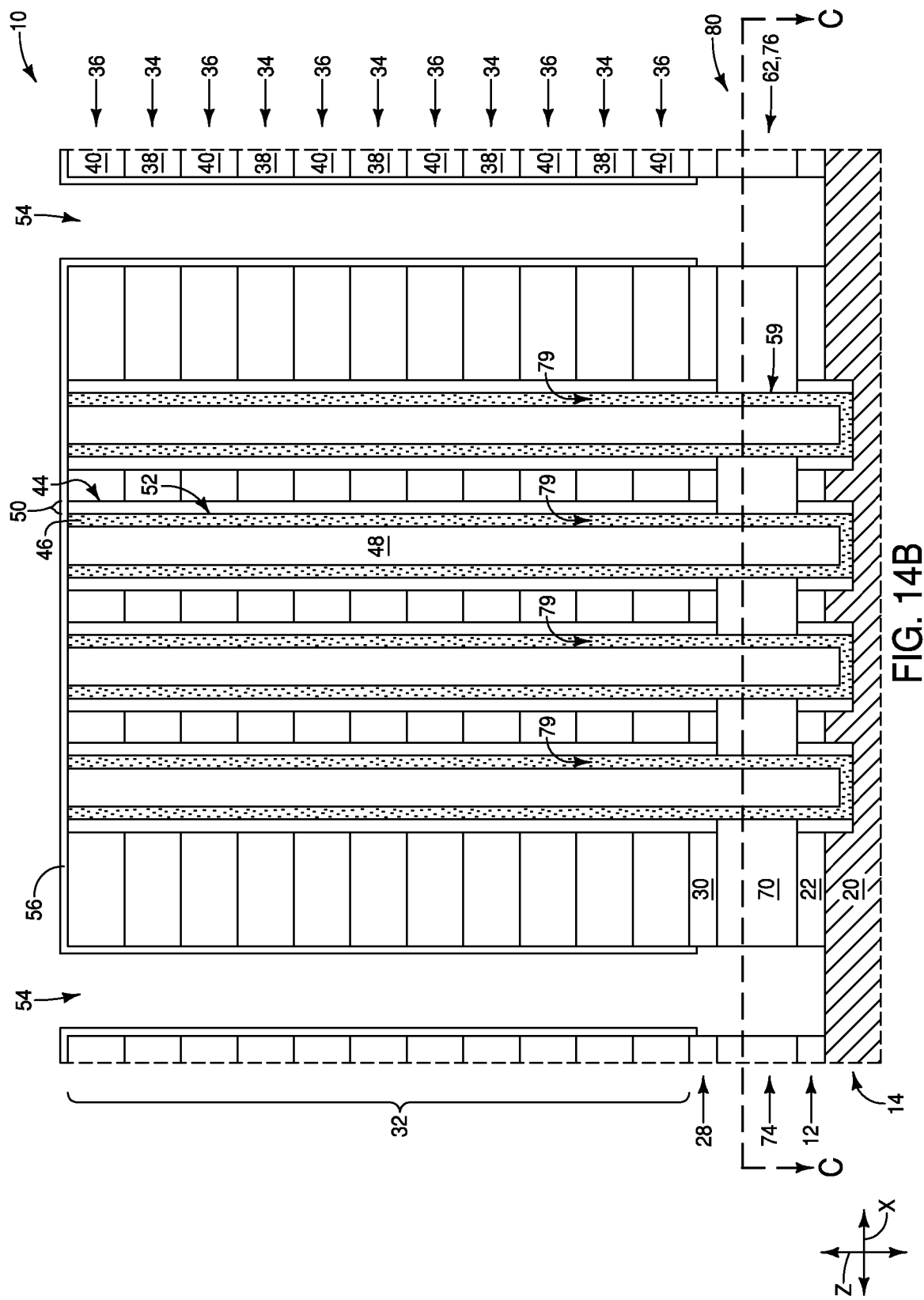
Figure 14C:
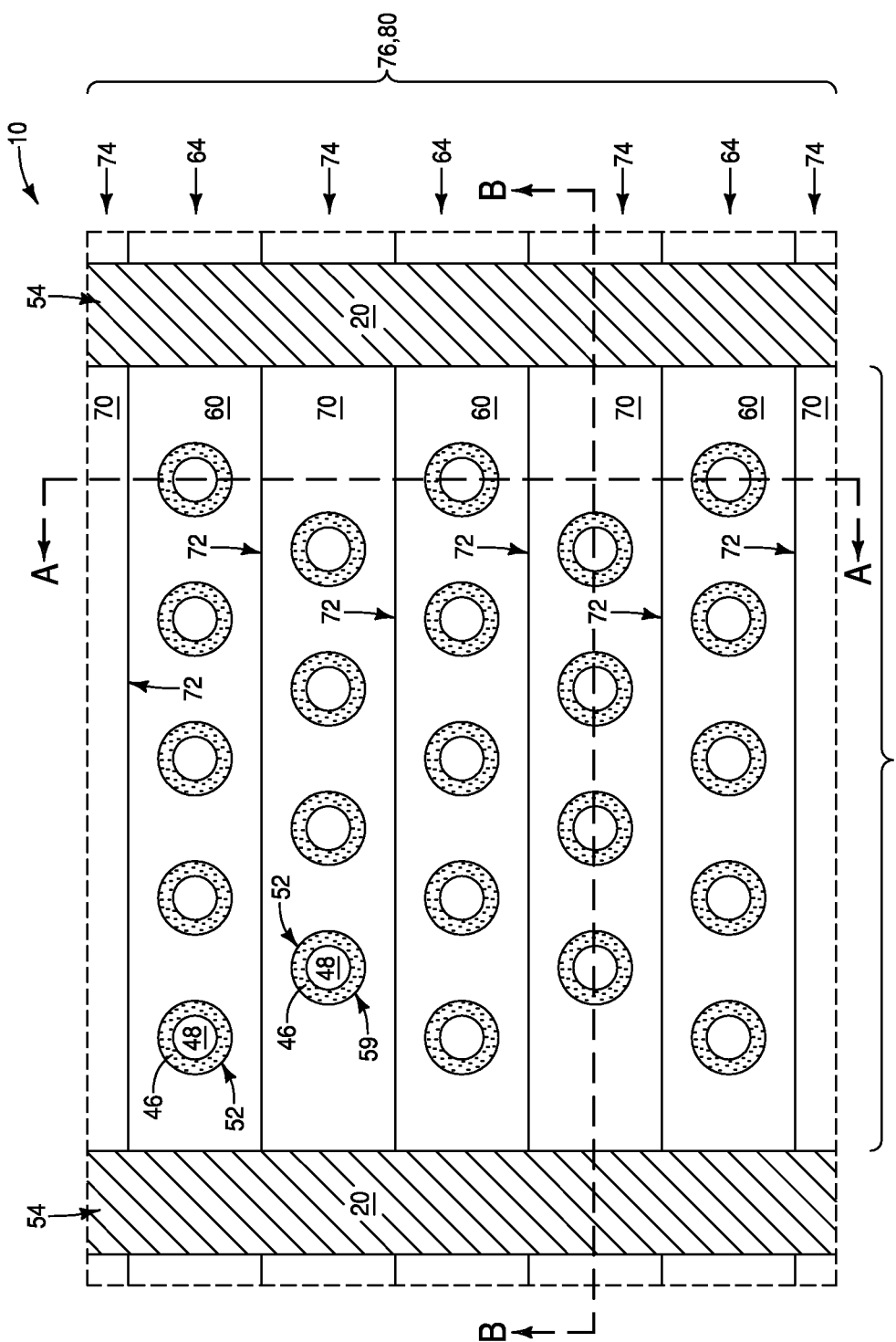

Referring to FIGS. 14-14C, replacement material 70 is formed within the conduits 68 (FIGS. 13-13C). The replacement material 70 may be conductively-doped semiconductor material, and may comprise a same semiconductor material as the channel material 46. In some embodiments, the replacement material 70 may comprise, consist essentially of, or consist of conductively-doped silicon. The replacement material 70 may be a conductive material, and in some embodiments may be referred to as a second conductive material formed within the level 62.

The conductive material 70 may be considered to be configured as conductive structures (conductive strips) 74, with such conductive structures extending linearly along the x-axis direction. Although the conductive structures 74 are shown to be straight along the x-axis direction, in other embodiments the structures 74 may be curved, wavy, etc.

In the illustrated embodiment, the replacement material 70 is formed directly against the sidewall surfaces 59 of the lower regions of the channel-material-pillars 52, as shown in FIGS. 14B and 14C.

The processing of FIGS. 13 and 14 may be considered to replace the sacrificial material 24 (FIGS. 12-12C) with the replacement material 70. In some embodiments, the processing of FIGS. 13 and 14 may be considered to replace a second sacrificial material (24) with a second replacement material (70).

FIG. 14C shows that the conductive structures 64 and 74 extend along the illustrated x-axis direction, and alternate with one another along the illustrated y-axis direction. Either the x-axis direction or the y-axis direction may be referred to as a first horizontal direction (or a first lateral direction), and the other may be referred to as a second horizontal direction (or a second lateral direction).

In some embodiments, the slits 54 may be considered to extend along a first horizontal direction, and the conductive structures 64 and 74 may be considered to extend along a second horizontal direction which is substantially orthogonal to the first horizontal direction.

The conductive structures 64 and 74 join to one another along interfaces 72 (labeled in FIG. 14C). Such interfaces may be detectable boundary regions between the structures 64 and 74. In some embodiments, the structures 64 and 74 may comprise different compositions relative to one another (i.e., the composition 60 may be different than the composition 70). For instance, the compositions 60 and 70 may comprise a same semiconductor material one another, but may comprise different levels of doping relative to one another. Alternatively, the compositions 60 and 70 may comprise different semiconductor materials relative to one another. In some embodiments, the structures 64 and 74 may comprise a same composition as one another. For instance, the compositions 60 and 70 may both comprise heavily-doped silicon. The heavily-doped silicon may comprise, for example, one or more n-type dopants (e.g., one or more of phosphorus, arsenic, etc.).

In embodiments in which the compositions 60 and 70 are the same as one another, the detectable boundaries 72 may correspond to detectable seams between the compositions 60 and 70 which result from the compositions 60 and 70 being formed sequentially relative to one another. The seams may be regions where grain boundaries change in orientation, size, etc.; regions where voids or other minor defects occur; etc. In some embodiments, the compositions 60 and 70 may be referred to as first and second conductive materials, respectively, and such first and second conductive materials may be substantially the same composition as one another.

The term "substantially the same" means the same to within reasonable tolerances of fabrication and measurement.

In some embodiments, the conductive structures 64 and 74 may be considered together to form a laminate 76. A region 78 of the laminate 76 extends between the slits 54.

In some embodiments, the conductive structures 64 and 74 may be incorporated into a conductive source structure 80 of a memory device. The conductive source structure includes the conductive structures 64 and 70, and the conductive expanse 20. The conductive source structure 80 also includes the material 22 of the layer 12 in the illustrated embodiment of FIGS. 14A and 14B. In other embodiments, the layer 12 may be omitted. Additionally, the conductive source structure 80 may include the material 30 of the layer 28, if such material is conductive. In other embodiments, the layer 28 may be omitted or may be insulative.

In the illustrated embodiment, the conductive materials 60 and 70 are directly against surfaces 59 of the channel-material-pillars 52. In some embodiments, the conductive materials 60 and 70 may comprise conductively-doped semiconductor material. Dopant may be out-diffused from the materials 60 and 70 into the channel material (semiconductor material) 46 to form a heavily-doped lower portion of the semiconductor material 46. Upper boundaries of the heavily-doped lower portions of the semiconductor material 46 may be along one of the levels 38, with such upper boundaries being diagrammatically illustrated as locations 79 within the cross-sectional views of FIGS. 14A and 14B. The out-diffusion from the doped materials 60 and 70 into the semiconductor material 46 may be accomplished with any suitable processing, including, for example, suitable thermal processing.

Figure 15:
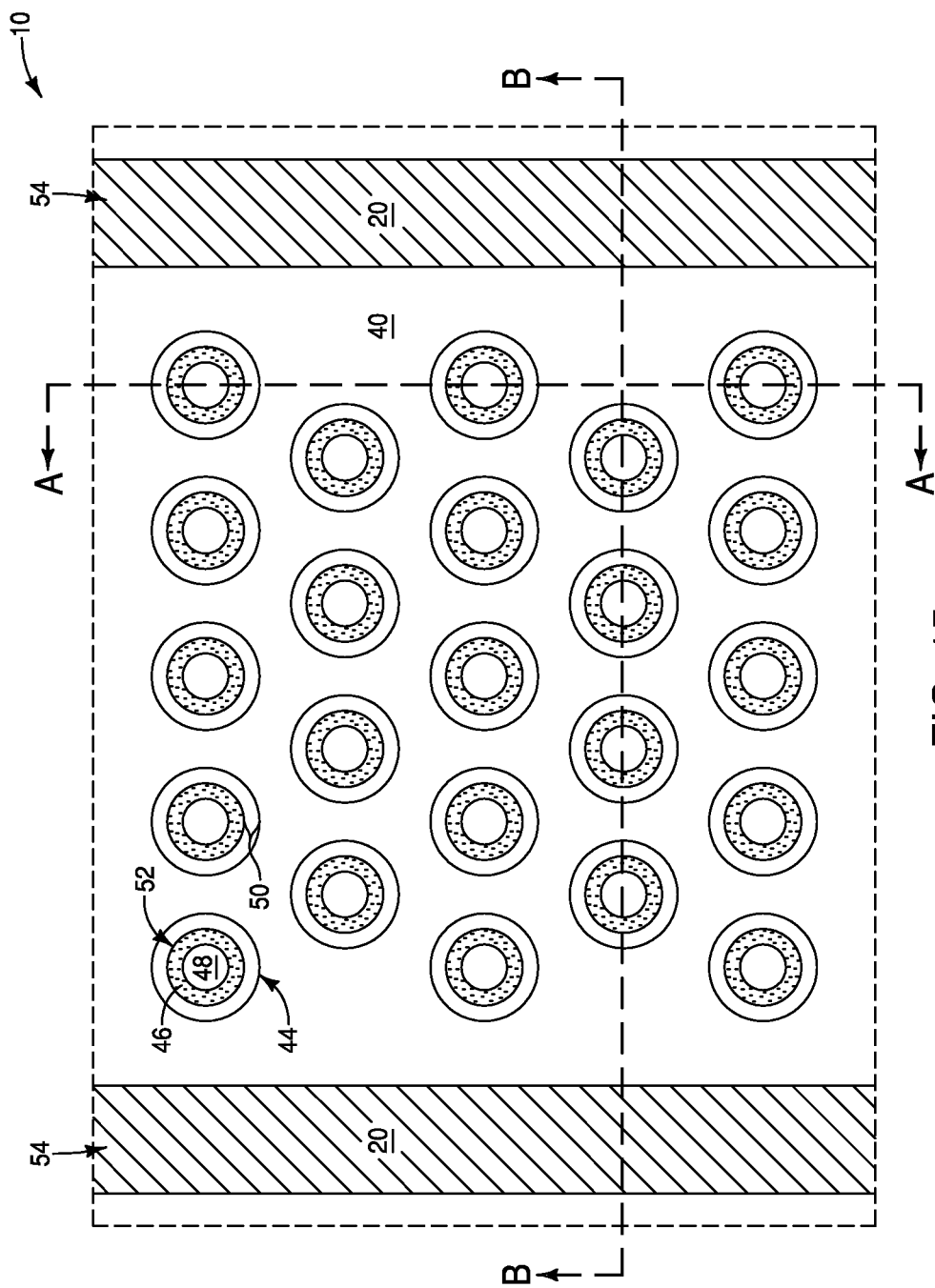
Figure 15A:
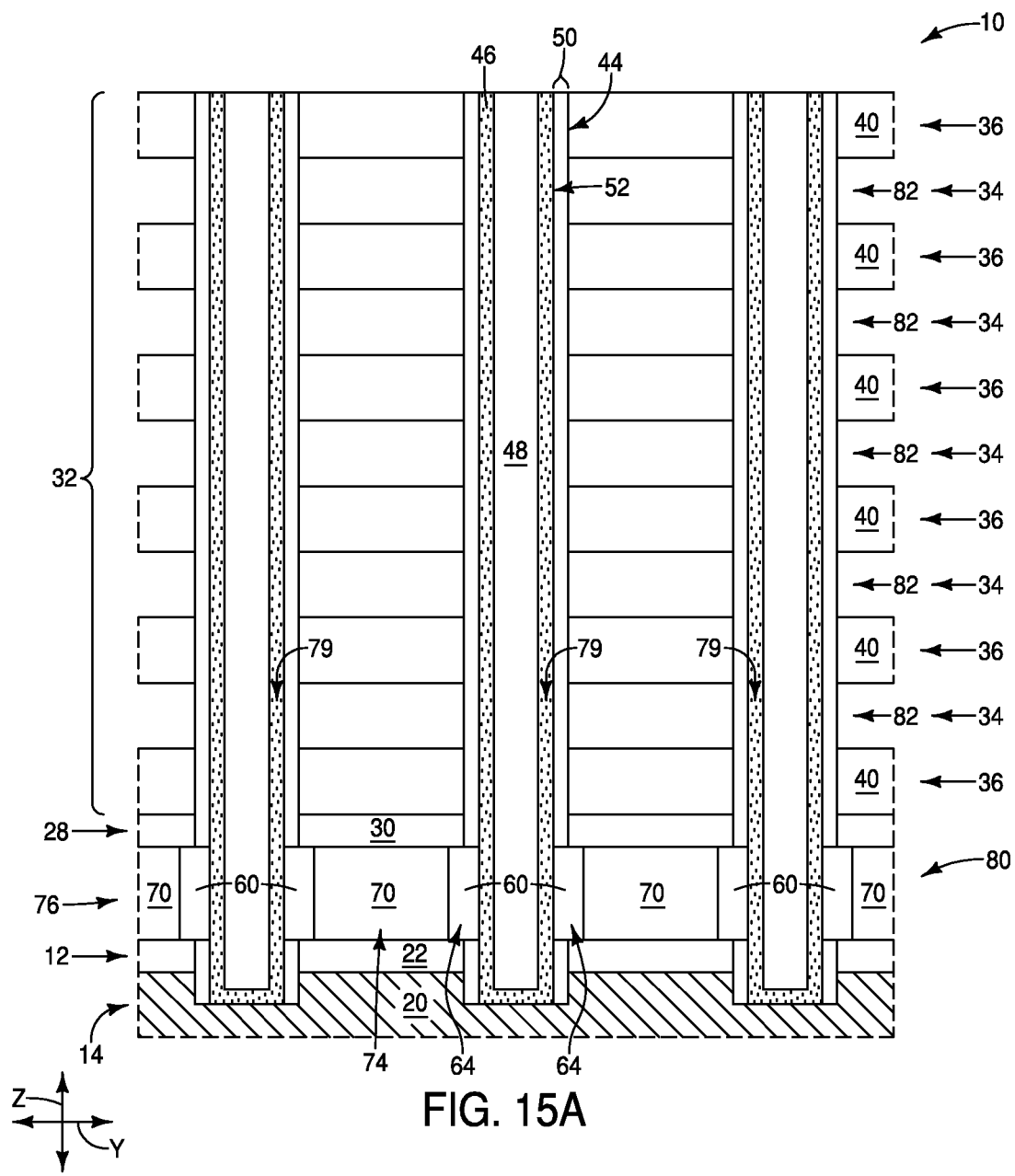
Figure 15B:
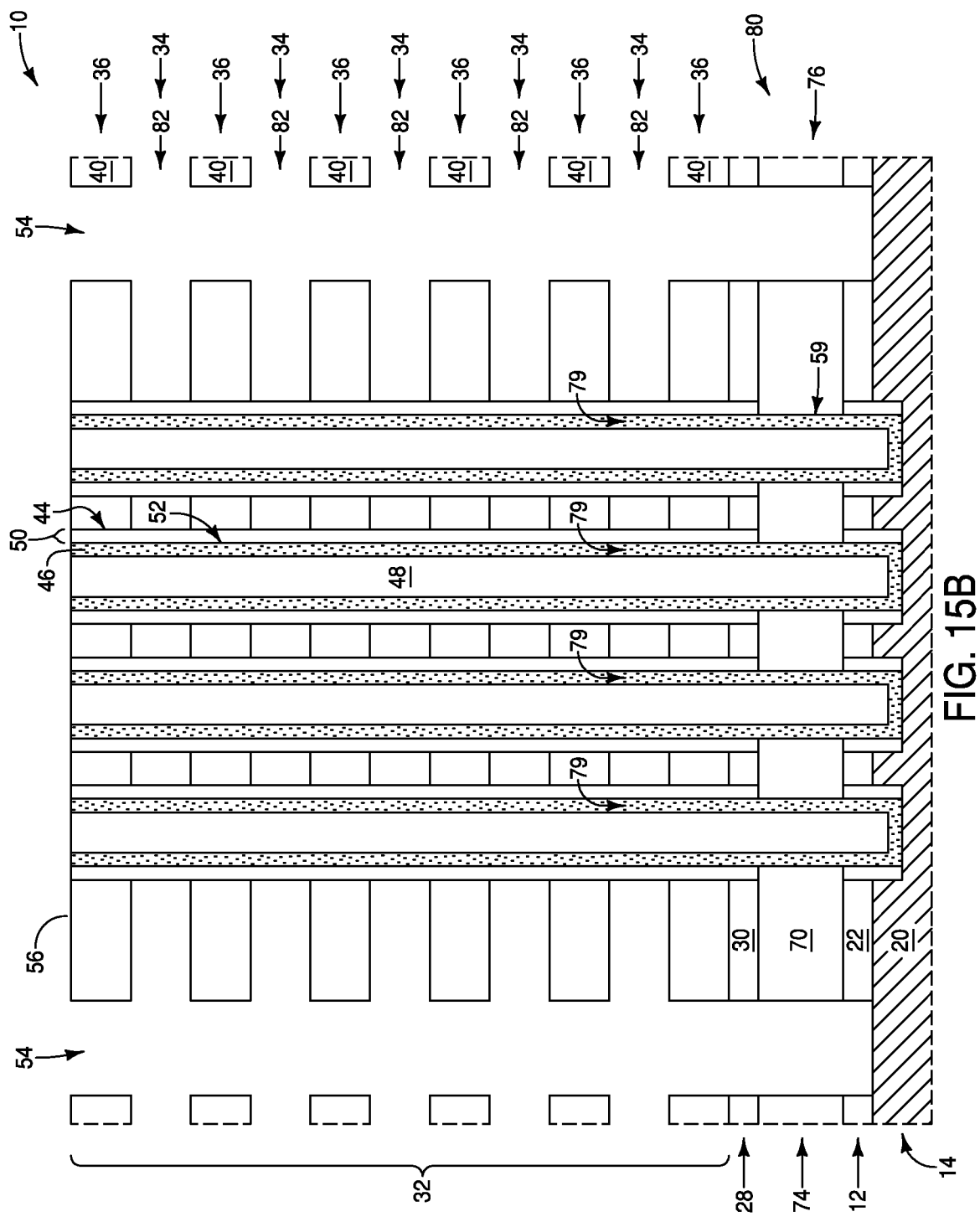
Figure 16:
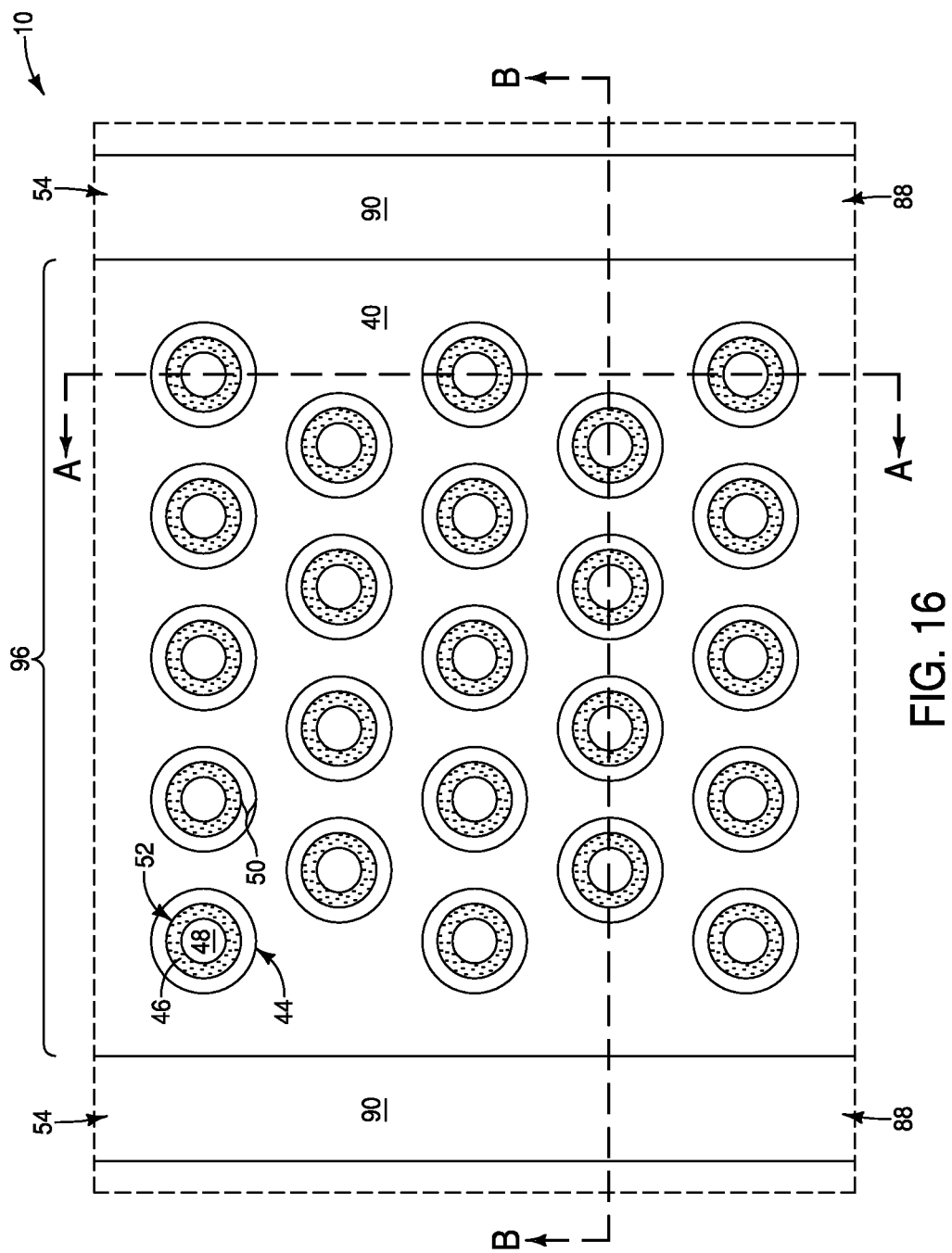

Referring to FIGS. 15-15B, the protective material 56 (FIGS. 14A-14B) is removed. Also, the material 38 (FIGS. 14A and 14B) of the first levels 34 is removed to leave voids 82 along the first levels 34. The material 38 may be removed with one or more etchants flowed into the slits 54. For instance, in some embodiments the material 38 may comprise silicon nitride, and may be removed with phosphoric acid flowed into the slits 54.

Figure 16A:
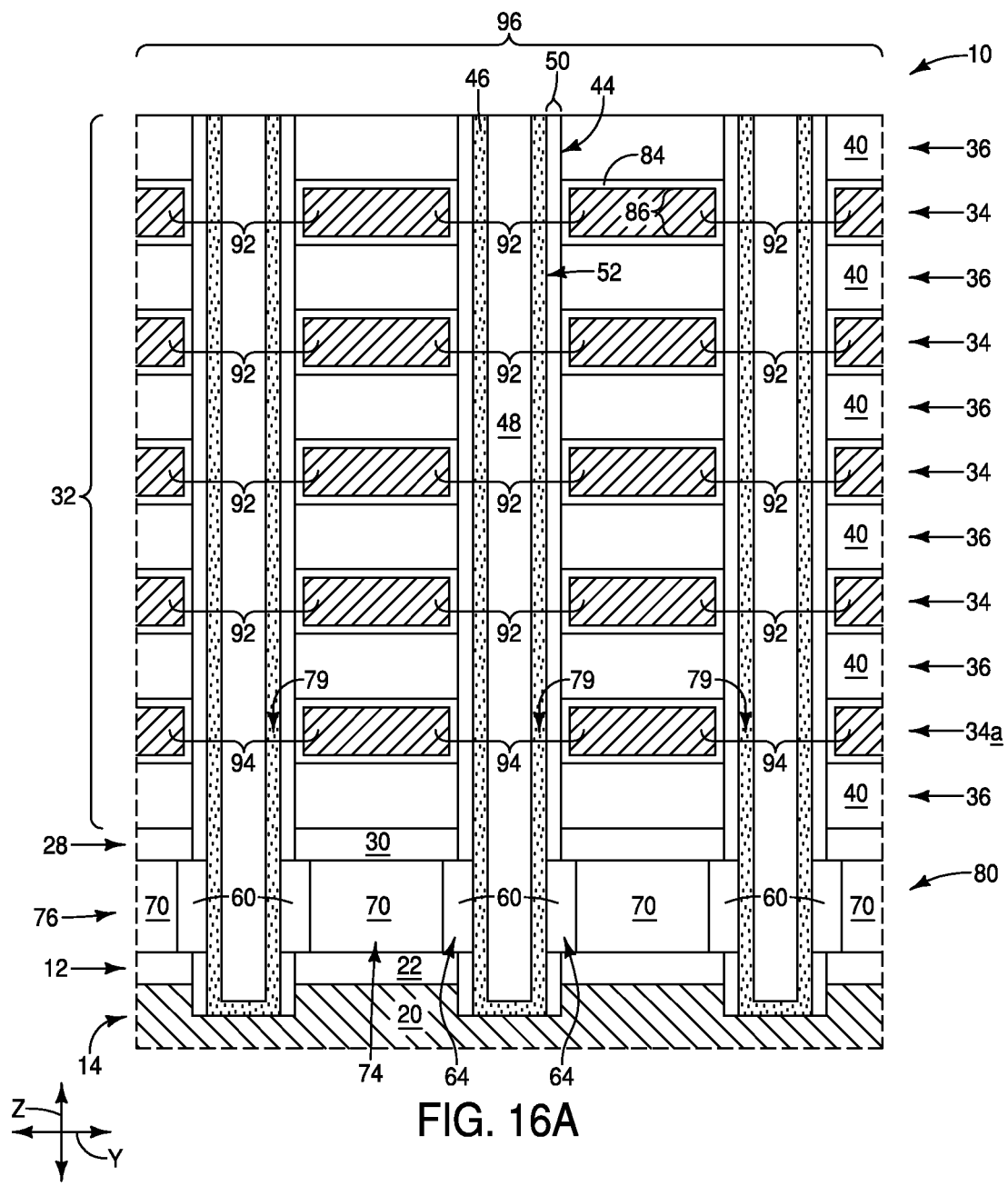
Figure 16B:
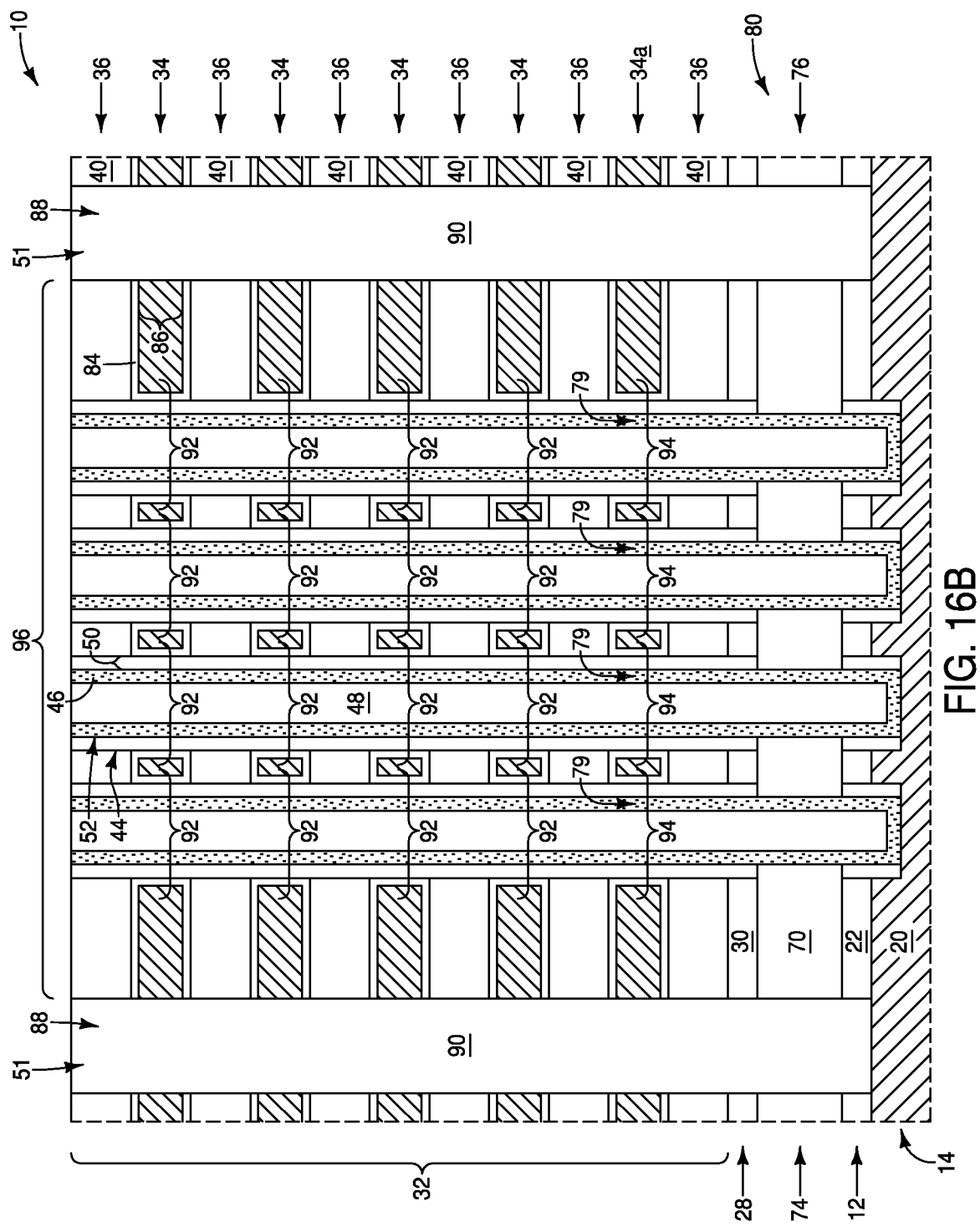
Figures 1, 16A:
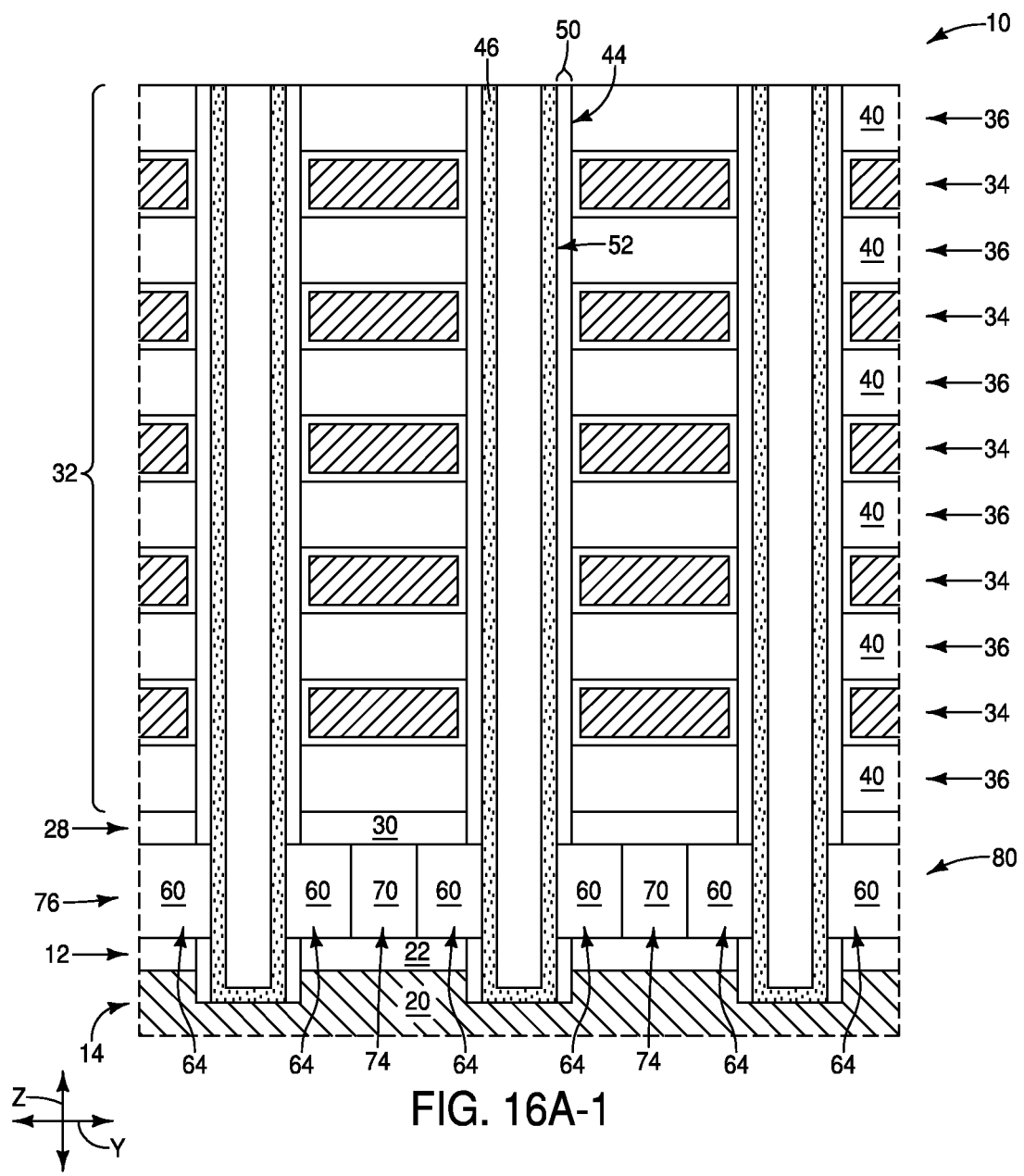

Referring to FIGS. 16-16B, dielectric-barrier material 84 and conductive material 86 are formed within the voids 82 (FIGS. 15A and 15B).

The dielectric-barrier material 84 may comprise any suitable composition(s), and in some embodiments may comprise one or more high-k materials. The term "high-k" means a dielectric constant greater than that of silicon dioxide (i.e., greater than about 3.9). Example high-k materials include aluminum oxide, hafnium oxide, zirconium oxide, etc.

The conductive material 86 may comprise any suitable composition(s); and in some embodiments may comprise a tungsten core at least partially surrounded by titanium nitride. The conductive material 86 may be referred to as a third conductive material to distinguish it from the first and second conductive materials 60 and 70 formed with the processing of FIGS. 11-14.

In some embodiments, the conductive material 86 may be considered to at least partially fill the voids 82 (FIGS. 15A and 15B). In some embodiments, the conductive material 86 may be considered to replace at least some of the sacrificial material 38 (FIGS. 14A and 14B).

The stack 32 of FIGS. 16-16B may be considered to comprise conductive first levels 34 which alternate with insulative second levels 36 along a vertical direction (an illustrated z-axis direction). In the illustrated embodiment, some regions of the dielectric-barrier material 84 may be considered to be associated with the levels 36 and other regions may be considered to be associated with the levels 34. Alternatively, the entirety of the dielectric-barrier material 84 may be considered to be associated with the conductive levels 34, even though the material 84 is not itself conductive.

After the materials 84 and 86 are formed within the voids 82, the slits 54 may be filled with one or more materials to form panels 88 within the slits. In the illustrated embodiment, the panels 88 comprise insulative material 90. The insulative material 90 may comprise any suitable composition(s), and in some embodiments may comprise, consist essentially of, or consist of silicon dioxide. Although the panels 88 are shown to comprise a single homogeneous material, in other embodiments the panels may comprise laminates of two or more different materials. For instance, the panels 88 may comprise a conductive material (e.g., conductively-doped silicon) laterally sandwiched between a pair of insulative materials (e.g., materials comprising silicon dioxide).

The assembly 10 of FIGS. 16-16B may be considered to be configured as a memory device comprising memory cells 92 and select devices (e.g., source-side select devices, SGS devices) 94. A lowermost of the conductive levels 34 is labeled 34a, and the tops 79 of the doped regions formed by out-diffusion into the lower portions of the channel-material-pillars (described above with reference to FIG. 14-14B) extends to the conductive level 34a. The conductive level 34a comprises the SGS devices 94. In the shown embodiment, the dopant within the channel material 46 extends partially across the level 34a to achieve the desired balance between non-leaky "OFF" characteristics for the SGS devices and leaky GIDL characteristics for the SGS devices. Although only one of the conductive levels 34 is shown to be incorporated into the source-side select devices, in other embodiments multiple conductive levels may be incorporated into the source-side select devices. The conductive levels may be electrically coupled with one another (ganged together) to be together incorporated into long-channel source-side select devices. If multiple of the conductive levels are incorporated into the source-side select devices, the out-diffused dopant may extend upwardly across two or more of the conductive levels 34 which are incorporated into the source-side select devices.

The memory cells 92 (e.g., NAND memory cells) are vertically stacked one atop another. The memory cells 92 are along the first levels (conductive levels) 34. Each of the memory cells comprises a region of the semiconductor material (channel material) 46, and comprises regions (control gate regions) of the conductive levels 34. The regions of the conductive levels which are not comprised by the memory cells 92 may be considered to be wordline regions (or routing regions) which couple the control gate regions with driver circuitry and/or with other suitable circuitry. The memory cells 92 also comprise the cell materials (e.g., the tunneling material, charge-storage material, and charge-blocking material) within the regions 50.

In some embodiments, the conductive levels 34 associated with the memory cells 92 may be referred to as wordline/control gate levels (or memory cell levels), in that they include wordlines and control gates associated with vertically-stacked memory cells of NAND strings. The NAND strings may comprise any suitable number of the memory cell levels. For instance, the NAND strings may have 8 of the memory cell levels, 16 of the memory cell levels, 32 of the memory cell levels, 64 of the memory cell levels, 512 of the memory cell levels, 1024 of the memory cell levels, etc.

The conductive materials 20, 60 and 70 together form the source structure 80 of a memory device. Such source structure may further include one or both of the layers 12 and 28. The source structure may be analogous to the source structures 216 described in the "Background" section. The source structure is shown to be coupled with control circuitry (e.g., CMOS). The control circuitry may be under the source structure 80 (e.g., may be associated with the base described above with reference to FIG. 5) or may be in any other suitable location.

In some embodiments, the channel-material-pillars 52 may be considered to be representative of a large number of substantially identical channel-material-pillars extending across the memory device 10; with the term "substantially identical" meaning identical to within reasonable tolerances of fabrication and measurement. The top-down view of FIG. 16 shows the pillars 56 arranged within a matrix (with the pillars 56 being hexagonally-packed in the illustrated embodiment), and shows the slits 54 extending along outer edges of the matrix of the channel-material-pillars. In some embodiments, the slits 54 may define a block region (memory-block-region) 96, with such block region being between the panels 88. Accordingly, the memory cells 92 may be considered to be within the block region 96 defined by the slits 54. The block region 96 may be analogous to the blocks (or sub-blocks) described above in the "Background" section of this disclosure.

FIG. 16A shows an embodiment in which the conductive structures 64 and 74 have about the same lateral widths as one another. In other embodiments, the structures 64 and 74 may have different lateral widths relative to one another. For instance, the structures 64 and 74 may be generated utilizing the assembly described above with reference to FIG. 5A-1, rather than the assembly of FIG. 5A. FIG. 16A-1 shows an assembly 10 analogous that of FIG. 16A, but in which the structures 64 and 74 have different lateral widths relative to one another. The assembly of FIG. 16A-1 may be formed by utilizing the assembly of FIG. 5A-1 in place of the assembly of FIG. 5A for the processing described herein.

An advantage of the processing described herein is that the weight of the stack 32 is well-supported during the fabrication of the laminate structure 76 (i.e., the laminate of the conductive structures 64 and 74). Specifically, since the sacrificial structures 16 and 18 (FIG. 5A) are replaced one-at-a-time to form the laminate structure 76, the stack 32 has substantial support during the entire process of forming the laminate structure 76. Conventional processes may form a homogeneous material analogous to the laminate structure, with such homogeneous material being formed in a single fabrication step. A difficulty encountered with such conventional processes is that the stack 32 may be supported only by the cell-material-pillars 44 at one or more stages of the processes, and such may not be sufficient to avoid buckling, bending and/or even collapsing of regions of the stack 32.

Although the embodiments described herein utilize sequential replacement of two different sacrificial materials (24 and 26) to form a laminate structure 76 having two different conductive structures (64 and 74) in an alternating (repeating) arrangement, it is to be understood that in other embodiments more than two different sacrificial materials may be sequentially replaced. The laminate structure (analogous to the structure 76) formed with such other embodiments may comprise two different conductive structures in an alternating (repeating) arrangement, or may comprise more than two different conductive structures in an arrangement (e.g., a repeating arrangement).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. Alternating strips of first and second sacrificial materials are formed over a conductive structure.

A stack of alternating first levels and insulative second levels is formed over the alternating strips. The first levels include first material and the second levels include insulative second material. Cell-material-openings are formed to extend through the stack and through at least some of the strips. Cell-material-pillars are formed within the cell-material-openings. Slits are formed to extend through the stack and through the strips. The strips extend along a first direction, and the slits extend along a second direction that crosses the first direction. The first sacrificial material is replaced with first conductive material and then the second sacrificial material is replaced with second conductive material. At least some of the first material of the stack is replaced with third conductive material to thereby form the stack to have conductive first levels alternating with the insulative second levels.

Some embodiments include an integrated assembly having a conductive expanse, and having alternating first and second strips over the conductive expanse. The first and second strips extend along a first direction. Interfaces between the first and second strips are detectable boundary regions. A stack having conductive first levels alternating with insulative second levels is over the strips. Cell-material-pillars extend through the stack and through the strips to the conductive expanse. Memory cells are along the conductive first levels and include regions of the cell-material-pillars.

Some embodiments include an integrated assembly having a memory-block-region between a pair of panels. The panels extend along a first direction. A conductive expanse is under the panels and directly against lower regions of the panels. A laminate is over the conductive expanse and between the panels. The laminate comprises alternating first and second structures. The first and second structures extend along a second direction which is substantially orthogonal to the first direction. Interfaces between the first and second structures are detectable boundary regions. A stack is over the laminate and comprises conductive first levels alternating with insulative second levels. Cell-material-pillars extend through the stack and through the laminate to the conductive expanse. Memory cells are along the conductive first levels and comprise regions of the cell-material-pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming laterally alternating first and second strips over a conductive structure, the first strips comprising first sacrificial material and the second strips comprising second sacrificial material;
   forming a stack of vertically alternating first levels and insulative second levels over the strips; the first levels comprising first material and the insulative second levels comprising insulative second material;
   forming openings to extend through the stack and through at least some of the strips;
   forming cell-material-pillars within the openings;
   forming slits to extend through the stack and through the strips; the strips extending along a first direction, and the slits extending along a second direction that crosses the first direction;
   replacing the first sacrificial material with first conductive material and then replacing the second sacrificial material with second conductive material; and
   replacing at least some of the first material of the stack with third conductive material to thereby form the stack to comprise conductive first levels vertically alternating with the insulative second levels.

2. The method of claim 1 wherein one of the first and second sacrificial materials comprises silicon nitride and the other comprises silicon dioxide.

3. The method of claim 1 wherein the first and second strips are about a same lateral thickness as one another.

4. The method of claim 1 wherein the first and second strips are different lateral thicknesses relative to one another.

5. The method of claim 1 further comprising forming insulative panels within the slits.

6. The method of claim 1 wherein the first and second conductive materials comprise conductively-doped semiconductor material.

7. The method of claim 1 wherein the first and second conductive materials comprise conductively-doped silicon.

8. The method of claim 1 wherein the first and second conductive materials comprise silicon doped with one or more n-type dopants.

9. The method of claim 1 wherein the first and second conductive materials are of different compositions relative to one another.

10. The method of claim 1 wherein the first and second conductive materials are of substantially the same composition as one another and join to one another along seams.

11. The method of claim 1 further comprising forming a first layer over the conductive structure prior to forming the alternating strips, and forming a second layer over the alternating strips prior to forming the stack.

12. The method of claim 11 wherein at least one of the first and second layers comprises heavily-doped semiconductor material.

13. The method of claim 11 wherein the first layer is electrically conductive, and wherein the second layer is electrically insulative.

14. The method of claim 1 wherein the cell-material-pillars include channel-material-pillars; wherein the first and second conductive materials comprise heavily-doped semiconductor material and are formed to be directly against the channel-material-pillars; and further comprising out-diffusing dopant from the heavily-doped semiconductor material into the channel-material-pillars, the out-diffused dopant extending upwardly to at least one of the first levels of the stack.

15. The method of claim 14 further comprising forming source-select devices to comprise said at least one of the first levels.

16. The method of claim 1 further comprising forming memory cells along the conductive first levels, with the memory cells comprising regions of the cell-material-pillars; wherein the integrated assembly includes a memory device which comprises the memory cells; and wherein the first and second conductive materials and the conductive structure together form at least a portion of a source structure of the memory device.

* * * * *